(12) United States Patent  
Ryu et al.

(10) Patent No.: US 8,148,731 B2
(45) Date of Patent: Apr. 3, 2012

(54) FILMS AND STRUCTURES FOR METAL OXIDE SEMICONDUCTOR LIGHT EMITTING DEVICES AND METHODS

(75) Inventors: Yungryel Ryu, Columbia, MO (US); Tae-seok Lee, Naperville, IL (US); Henry W. White, Columbia, MO (US)

(73) Assignee: Moxtronics, Inc., Simi Valley, CA (US)

( * ) Notice: Subject to any disclaimer, the term of this patent is extended or adjusted under 35 U.S.C. 154(b) by 476 days.

(21) Appl. No.: 11/846,191

(22) Filed: Aug. 28, 2007

(65) Prior Publication Data

US 2008/0073643 A1    Mar. 27, 2008

Related U.S. Application Data

(60) Provisional application No. 60/823,856, filed on Aug. 29, 2006.

(51) Int. Cl.
  *H01L 33/28*    (2010.01)
(52) U.S. Cl. .............. 257/78; 257/43; 257/76; 257/94; 257/102; 257/103; 257/190; 257/201; 257/E33.019; 257/E33.02; 257/E33.021
(58) Field of Classification Search ............ 257/78, 257/79, 94, 102, 190, 201, 13, 43, 76, 103, 257/E33.019, E33.02, E33.021, E33.022
See application file for complete search history.

(56) References Cited

U.S. PATENT DOCUMENTS

| | | | |
|---|---|---|---|
| 5,838,707 A | 11/1998 | Ramdani | |
| 6,291,085 B1 | 9/2001 | White | |
| 6,342,313 B1 | 1/2002 | White | |
| 6,373,100 B1 | 4/2002 | Pages | |
| 6,410,162 B1 * | 6/2002 | White et al. | 428/642 |
| 6,475,825 B2 | 11/2002 | White | |
| 6,515,308 B1 | 2/2003 | Kneissl | |
| 6,610,141 B2 | 8/2003 | White | |
| 6,674,098 B1 | 1/2004 | Niki | |
| 6,770,913 B2 * | 8/2004 | Iwata et al. | 257/79 |
| 6,809,342 B2 * | 10/2004 | Harada | 257/79 |
| 7,132,691 B1 * | 11/2006 | Tanabe et al. | 257/79 |
| 2004/0211969 A1 | 10/2004 | Ishizaki | |
| 2006/0138445 A1 * | 6/2006 | Zhao et al. | 257/102 |
| 2006/0233969 A1 * | 10/2006 | White et al. | 427/576 |

FOREIGN PATENT DOCUMENTS

| WO | WO 0016411 A1 * | 3/2000 |
|---|---|---|
| WO | WO 2004020686 A2 * | 3/2004 |

* cited by examiner

*Primary Examiner* — Jerome Jackson, Jr.
*Assistant Examiner* — Yu Chen
(74) *Attorney, Agent, or Firm* — Karish & Bjorgum, PC

(57) ABSTRACT

Semiconductor films and structures, such as films and structures utilizing zinc oxide or other metal oxides, and processes for forming such films and structures, are provided for use in metal oxide semiconductor light emitting devices and other metal oxide semiconductor devices, such as ZnO based semiconductor devices.

24 Claims, 10 Drawing Sheets

FILMS AND STRUCTURES FOR METAL OXIDE SEMICONDUCTOR LIGHT EMITTING DEVICES AND METHODS

CROSS-REFERENCE TO RELATED APPLICATIONS

This application for patent claims the priority benefit of U.S. Provisional Application Patent Ser. No. 60/823,856 filed Aug. 29, 2006, which is incorporated by reference herein as if set forth in its entirety.

FIELD OF THE INVENTION

The present invention relates generally to semiconductors, and, more particularly, to improved films and structures comprising zinc oxide and zinc oxide alloy materials to form light emitting devices, and processes for preparing such films and structures. Such semiconductor films and structures can be used to improve the function and performance of semiconductor devices.

BACKGROUND OF THE INVENTION

The optical properties of zinc oxide (ZnO) have been studied for potential use in semiconductor devices, in particular for photonic light emitting devices such as light emitting diodes (LEDs), laser diodes (LDs) and photonic detectors such as photodiodes. The energy band gap of ZnO is approximately 3.3 electron volts (eV) at room temperature, corresponding to a wavelength of approximately 376 nanometer (nm) for an emitted photon of this energy. Light emission has been demonstrated from ZnO LEDs using p-type and n-type materials to form a diode. ZnO has also been used to fabricate a UV photodetector and a field effect transistor (FET).

ZnO has several important properties that make it a promising semiconductor material for optoelectronic devices and applications. ZnO has a large exciton binding energy, 60 meV, compared with 26 meV for GaN and 20 meV for ZnSe. The large exciton binding energy for ZnO indicates promise for fabrication of ZnO-based devices that would possess bright coherent emission/detection capabilities at room and elevated temperatures. ZnO has a very high breakdown electric field, estimated to be about $2\times10^6$ V/cm (greater than two times the GaAs breakdown field), indicating thereby that high operation voltages could be applied to ZnO-based devices for high power and gain. ZnO also has a saturation velocity of $3.2\times10^7$ cm/sec at room temperature, which is larger than the values for gallium nitride (GaN), silicon carbide (SiC), or gallium arsenide (GaAs). Such a large saturation velocity indicates that ZnO-based devices would be better for high frequency applications than ones made with these other materials.

Still further, ZnO is exceptionally resistant to radiation damage by high energy radiation. Common phenomena in semiconductors caused by high-energy radiation are the creation of deep centers within the forbidden band as well as radiation-generated carriers. These effects significantly affect device sensitivity, response time, and read-out noise. Therefore, radiation hardness is very important as a device parameter for operation in harsh environments such as in space and within nuclear reactors.

From the perspective of material radiation hardness, ZnO is much better suited for space operation than other wide bandgap semiconductors. For example, ZnO is about 100 times more resistant than is GaN against damage by high-energy radiation from elections or protons.

ZnO also has a high melting temperature, near 2000° C., providing possibilities for high temperature treatments in post-growth processes such as annealing and baking during device fabrication, as well as for applications in high temperature environments.

Large-area ZnO single crystal wafers (up to 75 mm diameter) are commercially available. It is possible to grow homo-epitaxial ZnO-based devices that have low dislocation densities. Homo-epitaxial ZnO growth on ZnO substrates will alleviate many problems associated with hetero-epitaxial GaN growth on sapphire, such as stress and thermal expansion problems due to the lattice mismatch.

ZnO has a shallow acceptor level, 129 meV, compared with 215 meV for GaN. The low value for the acceptor level means that p-type dopants in ZnO are more easily activated and thereby help generate a higher hole concentration in ZnO than the corresponding hole concentration in GaN for the same dopant concentration in each material. ZnO based devices can be fabricated by a wet-chemical etch process. These properties make ZnO a most attractive material for development of near- to far-UV detectors, LEDs, LDs, FETs, and other optoelectronic devices.

It would be desirable to modify the films and structures of ZnO based light emitting semiconductor devices and method of preparing such films and structures, to achieve one or more of the following: to contain and confine electrical carriers in the active region for increasing the efficiency of carrier combination for producing light, to provide waveguides for light generated in the device for increasing the efficiency for light extraction from the device, to obtain desired spectral intensity versus wavelength of light extracted from the device by modifying the path by which light generated in the device is extracted from the device, to obtain desired spectral intensity versus wavelength of light extracted from the device by modifying the properties of material layers in the path by which light generated in the device is extracted from the device, to obtain desired spectral intensity versus wavelength of light extracted from the device by addition of material layers such as phosphors in the path by which light generated in the device is extracted from the device, to provide for emission of a multiplicity of wavelengths from the active layer region, and to obtain stimulated emission of radiation in order to provide for increased function, capability and performance of semiconductor devices.

It would also be desirable to modify the films and structures of ZnO based light emitting semiconductor devices and method of preparing same to reduce leakage currents to values lower than those for present ZnO based semiconductor devices, to improve electrical contact to films and substrates to make them electrically less resistive and more ohmic than those for present ZnO based semiconductor devices, to improve the passivation properties of films to provide protection of the device from undesirable impurity elements and chemicals to make their lifetime longer than those for present ZnO based semiconductor devices in order to provide for increased function, capability and performance of semiconductor devices.

A material with band gap energy larger than ZnO in a ZnO based semiconductor device may be used to form cladding layers and barrier layers for confining electrical carriers and photons in a semiconductor device.

A material with band gap energy larger than ZnO in a ZnO based semiconductor device may be used to form blocking layers to alter the movement of electrical carriers in a semiconductor device. Blocking layers may be used as a blocking layer to reduce transport of electrons, ions, atoms and molecules. A blocking layer may be used to reduce flow of undesirable impurity species and thereby provide passivation resistance to a semiconductor device. Undesirable impurity species include $H_2$, H, OH, $CO_2$, $H_2O$, $O_2$, and chlorine. It would be desirable to form a passivation layer in a semiconductor structure that serves as a barrier layer to undesirable impurity species in order to provide for increased function, capability and performance of semiconductor devices. It would be desirable to form a semiconductor alloy layer with higher passivation resistance than the passivation resistance of ZnO in order to provide for increased function, capability and performance of semiconductor devices.

Wet chemical etching is a useful process in the preparation of ZnO based semiconductor devices. A material that is a semiconductor alloy of ZnO may be used to form a layer that has a lower etch rate than the etch rate of ZnO. The differences in etch rate may be used to form useful structures in ZnO based semiconductor devices. It would be desirable to form a semiconductor layer with a wet-chemical etch rate that is lower than the wet-chemical etch rate of ZnO in order to provide for increased function, capability and performance of semiconductor devices.

A layer in a semiconductor device that has an energy band gap that is larger than the energy band gap of a nearby layer can serve as a waveguide layer for light in the device.

A layer in a semiconductor device that has an energy band gap that is larger than the energy band gap of an adjacent layer can serve as a barrier layer to confine electrical carriers in a region of a ZnO based semiconductor device to improve the efficiency of the device for conversion of electrical current to light.

A layer in a semiconductor device that has an energy band gap that is larger than the energy band gap of a nearby layer can serve as a cladding layer to confine electrical carriers in a region of a ZnO based semiconductor device to improve the efficiency of the device for conversion of electrical current to light.

A substrate in a semiconductor device that has either p-type conduction or n-type conduction can be used to form desirable electrodes on the substrate and to make desirable electrical contact to the device.

A layer or substrate in a semiconductor device that has surface or bulk damage or surface roughness can alter the spectral intensity versus wavelength of light passing through the region that contains either bulk damage or surface roughness.

A layer or substrate in a semiconductor device that has one or more phosphor coatings can alter the spectral intensity versus wavelength of light passing through the phosphor coating. The coating can be comprised of one, or more than one, coating selected from the list consisting of, but not limited to, a single layer coating of an area, a composite coating of several phosphors, and a multilayer of different phosphors.

ZnO can be used as an active layer material. An active layer in a semiconductor device that has energy band gap lower than ZnO can be used for obtaining emission of light having wavelength longer than that emitted from a ZnO active layer. An active layer in a semiconductor device that has energy band gap higher than that for ZnO can be used for obtaining light having wavelength shorter than that emitted from a ZnO active layer.

A layer comprised of a metal or metal alloy can be used as either as a reflector layer and/or as an electrical contact layer. If a metal or metal alloy layer is used for both a reflector layer and an electrical contact layer then herein it is called a metallic reflector-electrical contact layer.

A distributed Bragg reflector (DBR) is a region comprised of layers of quarter-wave epitaxial layers that alternate between high and low refractive index, e.g., ZnO and a BeZnO alloy. Such a Bragg reflector layer region can have high optical reflectivity for wavelengths close to the spectral wavelength for which it is designed. Design parameters include the number of layer pairs, index difference, and the choice of layer material and its thickness for purposes of matching a Bragg reflector surface to its adjoining medium.

A flip-chip structure is one that allows contact to be made to a semiconductor device such as an LED that allows for extraction of generated light through the substrate. A commonly used flip-chip structure is one whereby one electrical contact is made to the substrate with an electrode design on the substrate that facilitates light extraction through the substrate. For example, a common electrode design is a perimeter strip that allows light to be transmitted through the interior region. The other electrical connection would be made to the topmost formed layer of the device, to an electrode with sufficient area and positioned in make electrical contact to a soft metal bump, such as indium (In). Contact to the metal bump can facilitate extraction of heat from the device during operation. Alternative designs are sometimes used. For example, an electrode in the shape of a square or circle that is located in the middle of the substrate face and occupies a small portion of the substrate face area is also commonly used.

Modification of the angle between the substrate edge and substrate face for a flip-chip can be employed an increase light extraction efficiency.

Such devices and capabilities include LEDs and LDs that emit in the UV and visible regions of the spectrum.

Semiconductor devices fabricated from ZnO based materials that can operate with increased performance, capability and function are desirable for use in many commercial and military sectors including, but not limited to devices and areas such as light emitters, photodetectors, FETs, PN diodes, PIN diodes, NPN transistors, PNP transistors, transparent transistors, circuit elements, communication networks, radar, sensors and medical image detectors.

Accordingly, it would be useful to provide ZnO based semiconductor films and structures and processes for preparing same that can be tailored to provide improved cladding and confinement layers, waveguide layers, carrier blocking layers, passivation layers, layers on which improved electrical contact can be made, and layers that increase quantum efficiency in the conversion of electrical energy to light energy for emitting devices, layers that are roughened or damaged for altering the spectral intensity versus wavelength for light, layers that contain one or more phosphors for altering the spectral intensity versus wavelength for light, layer structures that serve as mirrors, layers that are metallic reflector-electrical contact layers, layer structures that serve as reflectors, and layer structures that serve as waveguides.

It would also be desirable to provide, for example, a BeZnO alloy semiconductor layer tailored to have an energy band gap that is higher than that for ZnO for use as cladding layer and barrier layers for confinement of carriers a semiconductor device, as well as other types of layers and structures having selected material or functional characteristics for use in various semiconductor light emitting devices and methods.

SUMMARY OF THE INVENTION

The invention addresses and meets the above-described needs, among others, by providing materials and processes for forming semiconductor film layers and structures for improvement in the confinement of carriers, for improvement in the ability to determine the path for light extraction by using reflector layers, mirrors and waveguides, for improvement in blockage of carrier flow, for improvement in changing the spectral intensity versus wavelength for light generated in the device, for improvement in the efficiency for extraction of light from the device, for improvement in the formation of electrodes, for making electrical contact, for reduction of current leakage, for passivation against unwanted impurities to improve the quantum efficiency for conversion of electrical energy to light energy in a light emitting ZnO based semiconductor device, to improve the attainment of desired spectral intensity versus wavelength features by use of waveguide layers for determining the paths by which light is extracted from the device, to improve the attainment of desired spectral intensity versus wavelength features by use of roughened surfaces and bulk damage, to improve the attainment of desired spectral intensity versus wavelength features by use of one or more phosphors to convert one or more wavelengths of light to different wavelengths of light from a semiconductor device, to provide structures to obtain stimulated emission of light (lasers), to improve the efficiency for extracting light generated in a semiconductor device, and to improve the efficiency for producing light with desired spectral color in a ZnO based semiconductor device.

In accordance with the present invention, the atomic fraction x of Be in the ZnBeO alloy system, namely, $Be_xZn_{1-x}O$, can be varied to increase the energy band gap to values higher than that of ZnO. Each alloy formed can be undoped, or p-type or n-type doped, by use of selected dopant elements.

ZnO single crystal substrates can be made with p-type conduction or with n-type conduction to facilitate formation on electrical contacts to the substrate and formation of electrodes on the substrate. As described below, in some embodiments of the invention, substrates used will be of different materials, or will not be single crystal substrates.

A semiconductor film can be formed into one or more layers that extend beyond the face of a mesa edge in a semiconductor device by a wet etching method that has a higher etch rate for ZnO than for BeZnO.

Various aspects of the invention also provide the following: a BeZnO semiconductor film formed into one or more layers in a semiconductor device to serve as a waveguide layer for light; and a BeZnO semiconductor film formed into one or more layers in a semiconductor device to serve as a cladding layer or as a barrier layer for confinement of electrical carriers.

The atomic fraction y of Cd, the atomic fraction z of Se, and the atomic fraction w of S in the ZnCdOSSe alloy system, namely, $Zn_{1-y}Cd_yO_{1-z-w}S_wSe_z$, can be varied to decrease the energy band gap of ZnO to values smaller than that of ZnO. Each alloy formed can be undoped, or p-type or n-type doped, by use of selected dopant elements.

For formation of reflector-electrical contact layers, Ti—Au and Al—Au alloys work well for forming such layers on n-type doped ZnO based materials, and Ni—Au alloys work well for forming such layers on p-type doped ZnO based materials.

These alloys and processes can be used to fabricate any of the following:
 1) optical and electronic semiconductor devices;
 2) a semiconductor device wherein the active layer region contains one, or more than one, active layer;
 3) a semiconductor device wherein the active layer region contains one, or more than one, active layer material;
 4) a semiconductor device wherein the active layer region contains active layers having different semiconductor materials that are selected from the list consisting of, but not limited to, ZnO, BeZnO alloys, and ZnCdOSSe alloys;
 5) a semiconductor device wherein multiple wavelengths of light are emitted;
 6) a semiconductor device wherein layers can serve as waveguides for light generated in the device;
 7) a semiconductor device wherein optical mirrors and reflection layers can be used to form a laser cavity; and/or
 8) a semiconductor device wherein stimulated emission of radiation occurs.

These structures and processes can be applied to improve the function, capability, and performance of semiconductor devices.

By way of particular example in connection with the present invention, various aspects of the invention provide:
 1) a BeZnO alloy semiconductor layer tailored to have an energy band gap that is higher than that for ZnO for use as cladding layer and barrier layers for confinement of carriers a semiconductor device;
 2) a layer comprised of a metal or metal alloy can be used as either as a reflector layer and/or as an electrical contact layer, and if used for both a reflector layer and an electrical contact layer then it would be useful to provide a metallic reflector-electrical contact layer;
 3) a BeZnO alloy semiconductor layer tailored to have an energy band gap that is higher than that for ZnO for use as blockage of carrier flow in a semiconductor device;
 4) a BeZnO alloy semiconductor layer tailored to have an energy band gap that is higher than that for ZnO for use as a waveguide layer for light in a semiconductor device;
 5) a BeZnO alloy semiconductor layer tailored to have an energy band gap that is higher than that for ZnO for use in extracting light from a semiconductor device;
 6) ZnO and ZnO based alloy semiconductor layers for that are roughened for altering the spectral intensity versus wavelength for light;
 7) a layer, in a semiconductor device, comprised of one or more phosphors for altering the spectral intensity versus wavelength for light;
 8) a layer, in a semiconductor device, that has surface roughness for altering the spectral intensity versus wavelength for light;
 9) a layer, in a semiconductor device, that has bulk damage for altering the spectral intensity versus wavelength for light;
 10) a BeZnO alloy semiconductor layer tailored to have specific passivation properties for protection of a semiconductor device;
 11) a BeZnO alloy semiconductor layer tailored to have specific blockage properties for protection of a semiconductor device from unwanted impurity contamination;
 12) a layer that can be used to improve electrical contact to a semiconductor device;
 13) a substrate that can be used to improve electrical contact to a semiconductor device;
 14) layers and structures that can reduce leakage currents in a semiconductor device;
 15) layers and structures that can increase the quantum efficiency for conversion of electrical energy to light energy in an emitting semiconductor device;
 16) one or more cladding and barrier layers and structures that would confine electrical carriers in desirable regions of the device to increase the quantum efficiency for conversion of electrical energy to light energy in an emitting semiconductor device, and that could serve as waveguides for light;
 17) a layer, in a semiconductor device, with energy band gap lower than that for ZnO for use as an active layer for obtaining light having wavelength longer than that for ZnO;

18) a layer, in a semiconductor device, with energy band gap higher than that for ZnO for use as an active layer for obtaining light having wavelength shorter than that for ZnO;

19) a layer, in a semiconductor device, with high reflectivity for light, and mirror surfaces for reflecting light;

20) structures, in a semiconductor device, adapted to obtain spontaneous emission from the semiconductor device;

21) structures, in a semiconductor device, operable to obtain white light emission from a semiconductor device;

22) structures, in a semiconductor device, operable to obtain white light emission from a semiconductor device through the substrate;

23) device mounting structures, usable in a semiconductor device, for increasing the efficiency of light extraction from a semiconductor device through the substrate;

24) modification of the geometrical shape of the substrate in a semiconductor device, for increasing the efficiency of light extraction from a semiconductor device through the substrate;

25) structures in a semiconductor device operable to obtain stimulated (laser) emission from the semiconductor device;

26) structures, in a semiconductor device, operable to obtain stimulated (laser) emission from the semiconductor device as a vertical cavity surface emitting laser (VCSEL);

27) VCSEL devices suitable for use in color printing, image display, image display, data storage, data readout, medical imaging, sensors, and/or spectroscopy;

28) structures, in a semiconductor device, operable to obtain stimulated (laser) emission, or other emission from the semiconductor device, wherein the device is mounted in a flip-chip structure;

29) structures, in a semiconductor device, operable to obtain stimulated (laser) emission from a semiconductor device as a vertical cavity surface emitting laser mounted in a flip-chip structure;

30) structures to obtain stimulated (laser) emission from a semiconductor device as an edge emitting laser;

31) an edge emitting laser device that can be used in water purification, air purification, antimicrobial purposes, color printing, image display, image projection, data storage, data readout, medical imaging, sensors, and/or spectroscopy;

32) substrates, layers and structures that would increase the efficiency for extraction of light from the active layer in an emitting semiconductor device;

33) substrates with either n-type or p-type electrical conduction for formation of electrodes and for making electrical contact to a semiconductor device to increase the efficiency of the device;

34) substrates with n-type electrical conduction for formation of electrodes and for making electrical contact to a semiconductor device to decrease the cost for fabricating the device;

35) substrates with p-type electrical conduction for formation of electrodes and for making electrical contact to a semiconductor device to decrease the cost for fabricating the device;

36) a semiconductor device wherein the active layer region contains one, or more than one, active layer;

37) a semiconductor device wherein the active layer region contains one, or more than one, active layer material; and 38) a semiconductor device wherein the active layer region contains active layers having different semiconductor materials.

Other embodiments, examples, features and aspects of the present invention will also be disclosed herein.

The foregoing description and other objects, advantages, and features of the invention and the manner in which the invention is accomplished will become more apparent after considerations of the following detailed description of the invention taken in conjunction with the accompanying drawings.

BRIEF DESCRIPTION OF THE DRAWINGS

Further understanding of the present invention is provided by the following Detailed Description read in connection with the attached drawing figures, in which.

DETAILED DESCRIPTION OF THE INVENTION

Figure 1:
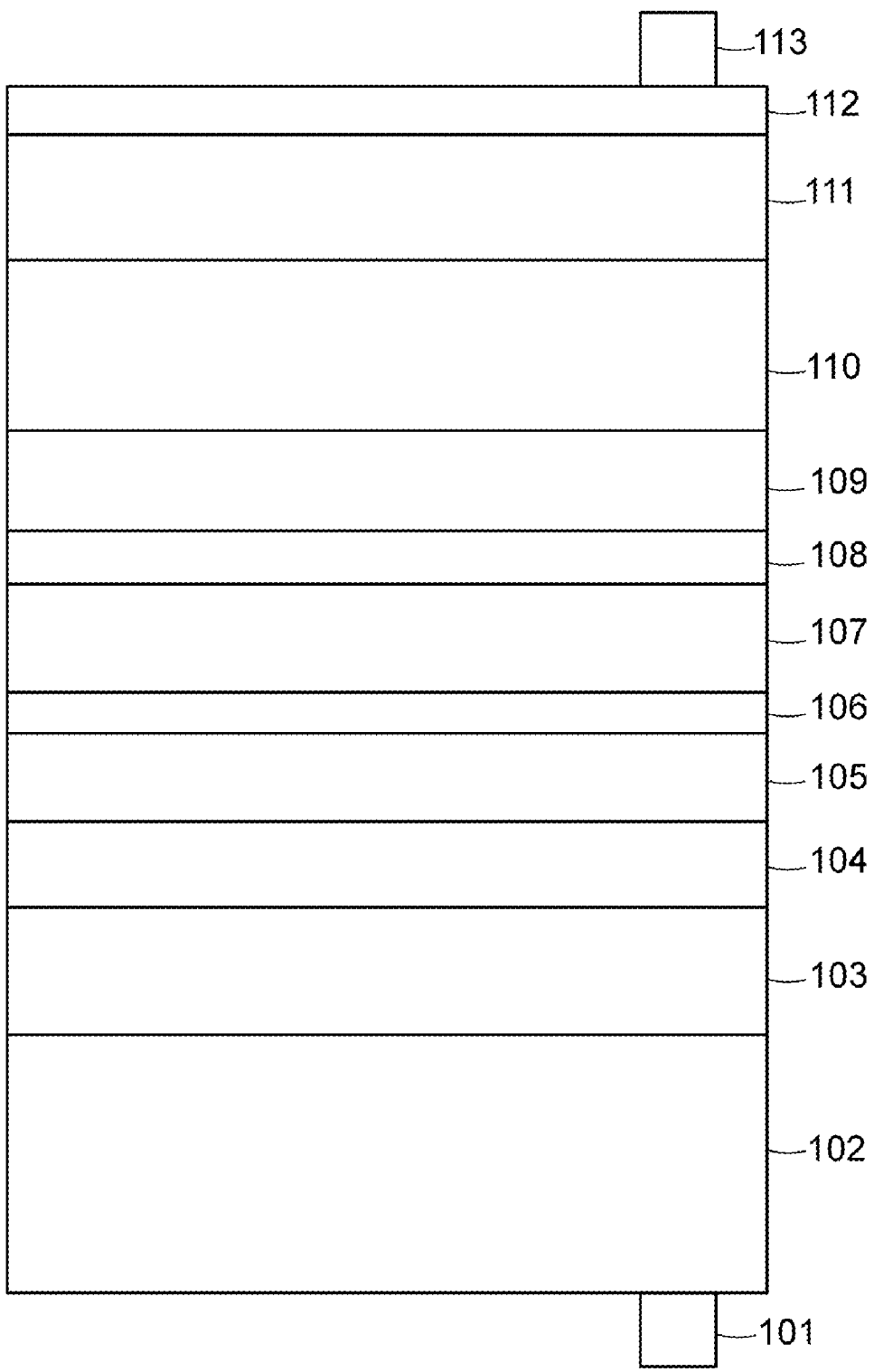
FIG. 1 is a schematic showing a ZnO based LED semiconductor device in accordance with the invention.

Overview and Terms Used in this Document:

The present invention relates to zinc oxide based semiconductor substrates, layers and materials that can be used to fabricate semiconductor light emitting devices, and to improve the function and performance of semiconductor devices. To facilitate understanding of the invention, we first provide a discussion of terms utilized in connection with describing the invention, which include the following:

The active layer of a LED or LD relates to the semiconductor layer from which light is emitted. Electrical carriers of n-type or p-type conductivity combine in the active layer. The value of the energy band gap determines the wavelength of the characteristic light emission.

A double heterostructure (DH), single quantum well (QW) structure or a multiple quantum well (MQW) structure is comprised of a layered semiconductor structure with one or more layers having a smaller energy band gap than one or more neighboring layer or layers so that n-type carriers and p-type carriers are more probable to be located in the layer or layers with smaller energy band gap. The characteristic wavelength of photonic emission is that associated with the semiconductor material with smallest energy band gap in a DH, QW, or MQW.

A super lattice (SL) structure is comprised of first layers and second layers of semiconductor material having different energy band gap values and wherein each first and second layer is sufficiently thin that it can strain if necessary to form an epitaxial layer with adjacent layers and wherein the first and second layers may have different concentrations of n-type dopant elements or may have different concentrations of p-type dopant elements. Use of a SL layered structure in lieu of a thick layer of uniform composition can be used to fabricate more efficient devices by reducing strain that may be created by use of a thick layer of a semiconductor material of uniform composition.

When light containing wavelengths shorter than red can generate red light when transmitted through a roughened surface or damaged material. Processes that can be used to prepare roughened surfaces and damaged material include, but are not limited to, chemical etching, ion implantation, and mechanical roughening.

Various designs for epitaxially layered structures have been proposed in the prior art to increase performance of semiconductor devices such as LEDs and LDs. Among these structures are semiconductor heterostructures that are comprised of alternate layers of materials that have different energy band gaps. Such heterostructures include but are not limited to double heterostructures, quantum wells, multiple quantum wells, superlattice layers, isolation layers, light reflecting films and multilayers, metal contact layers, cladding layers and substrates.

A vertical cavity surface emitting laser (VCSEL) is designed to produce stimulated emission in a vertical cavity—so named because the cavity length is perpendicular to the semiconductor layer structure. The cavity length can be adjusted by varying the total thickness spacer layer—comprised of the active layer region, barrier layer regions, and cladding layer regions. The thickness of the spacer layer is typically equal to one emission wavelength. The two vertical cavity mirrors are typically formed by DBRs.

An edge emitting semiconductor laser diode typically has a slab design from which stimulated laser emission is from the active layer through one of the cavity end mirrors. The cladding and barrier layers function as optical waveguides for the cavity in an edge emitting laser. The mirror at each end of the laser cavity for an edge emitting laser can be formed by several different processes, or a combination of, processes including, but not limited to, cleaving, polishing, coating with a dielectric material, and metallization. The cavity length of an edge emitting laser is typically a factor of several hundred larger that the emission wavelength.

The lower limit for the wavelength emitted by an LED, VCSEL or LD can be made smaller by increasing the value of the energy band gap of the active layer in which light emission occurs. In accordance with the present invention as further described below, the energy band gap of ZnO can be increased by alloying ZnO with a suitable material using a suitable growth method.

The upper limit for the wavelength emitted by an LED, VCSEL or LD can be made larger by decreasing the value of the energy band gap of the active layer in which light emission occurs. In accordance with the invention as further described below, the energy band gap of ZnO can be decreased by alloying ZnO with a suitable material using a suitable growth method.

"Band gap modulation" and "band gap engineering" are terms used herein in connection with the present invention, to changing the band gap of a material to either increase or decrease the value of the energy band gap.

In accordance with the invention, band gap modulation can be used to increase photon and carrier confinement in a semiconductor device. Band gap modulation can be used to tailor the wavelength of light emission in a light emitting semiconductor device and to improve the response characteristics of a photodetector semiconductor device.

In accordance with the invention, ZnO based semiconductor devices can be grown on substrates, either n-type doped, p-type doped or undoped, selected from the list consisting of, but not limited to, ZnO, GaN, Sic, and silicon. Undoped sapphire is also available.

In accordance with the invention, two electrical leads are made to a semiconductor diode device, such as a LED, VCSEL or LD and a bias is applied to achieve light emission. A voltage of more negative polarity is applied to a point on the device with good electrical conduction to the n-type region, and a voltage of more positive polarity is applied to a point on the device with good electrical conduction to the p-type region, thereby providing a bias across the active layer region. The choice for location of electrical contact points is made, in part, by consideration of device performance, ease of manufacture, and cost. Desirable locations for electrical connections include the topmost layer, and also the exposed surface of the substrate if the substrate has adequate electrical conduction. Alternatively, electrical contact can be made to a portion of the substrate onto which semiconductor layers have been deposited, or to layers in close proximity to the substrate, by selective removal of portions of deposited semiconductor layers by means such as reactive ion etching.

In accordance with the invention, a desired pattern for each of the two electrodes for making electrical connection to an edge emitting laser device typically extends the length of the active layer region stripe to promote increased device efficiency.

An electrical contact layer may also serve as a reflector layer in a light emitting semiconductor device.

A buffer layer region can be used, in some embodiments, to improve the quality of surface onto which other semiconductor layers such as cladding layers and DBRs can be formed. A buffer layer region may be comprised of one, or more than one, layer. A buffer layer region in contact with an n-type substrate may be either undoped or n-type doped. A buffer layer region in contact with a p-type substrate may be either undoped or p-type doped. The devices described herein can also be constructed without a buffer layer region, in which case one or more of the other layers described herein can be formed, for example, on the substrate.

Prior art documents have discussed increasing the energy band gap of ZnO to 3.99 eV at room temperature by alloying ZnO with magnesium (Mg) to form ZnMgO; namely, $Zn_{1-w}Mg_wO$. As the content of Mg was increased up to w=0.33, the energy band gap was increased to 3.99 eV. Heterostructures were fabricated by using ZnO and ZnMgO layers. However, a crystal phase separation occurs between MgO and ZnO if the Mg-content exceeds the value corresponding to w=0.33 due to the different crystal structure between ZnO and MgO and large difference in lattice constants. MgO has a cubic lattice structure with lattice spacing 0.422 nm, whereas ZnO is hexagonal with 0.325 nm. Therefore, ZnMgO alloys have limited utility, for increasing the energy band gap in semiconductor devices up to 3.3 eV but not to larger energy band gap values.

It is contemplated that further work in this area will lead to an increase in the band gap to values larger than approximately 3.3 eV in order to fabricate semiconductor devices that can operate at short wavelengths. For simplicity of growth, it would be desirable to have an alloy system comprised of one set of elements to cover the energy band gap range from approximately 3.3 eV to an energy band gap value of approximately 10.6 eV, corresponding to a wavelength of approximately 117 nm, The present invention, as described in greater detail below, enables such an alloy system.

Beryllium oxide (BeO) has an energy band gap of approximately 10.6 eV at room temperature, corresponding to a wavelength of approximately 117 nm. BeO has a hexagonal lattice structure.

It is contemplated that further work in this area will lead to a decrease in the band gap to values smaller than approximately 3.3 eV in order to fabricate semiconductor devices that can operate at long wavelengths. For simplicity of growth, it would be desirable to have an alloy system comprised of one set of elements to cover the energy band gap range from approximately 3.3 eV to an energy band gap value of approximately 1.75 eV, corresponding to a wavelength of 710 nm. The present invention enables such an alloy system.

Cadmium selenide (CdSe) has an energy band gap of approximately 1.75 eV, corresponding to a wavelength of approximately 710 nm. CdSe can be grown with a hexagonal lattice structure using proper growth conditions.

Cadmium sulfide (CdS) has an energy band gap of approximately 2.41 eV, corresponding to a wavelength of approximately 514 nm. CdS can be grown with a hexagonal lattice structure using proper growth conditions.

Zinc selenide (ZnSe) has an energy band gap of approximately 2.8 eV, corresponding to a wavelength of approximately 444 nm. ZnSe can be grown with a hexagonal lattice structure using proper growth conditions. ZnO, BeO, CdSe, CdO and ZnSe are Group III-VI compounds.

Collectively, the energy band gap values for ZnO based alloys comprised of the two alloy systems—BeZnO, namely, $Be_xZn_{1-x}O$, with x varying between 0 and 1 as required, and ZnCdOSe, namely, $Zn_{1-y}Cd_yO_{1-z-w}S_wSe_z$, with y varying between 0 and 1 as required and with z and w varying between 0 and 1 independently as required—would span the range from approximately 10.6 eV to approximately 1.75 eV, corresponding to a wavelength range from approximately 117 nm to approximately 710 nm.

In the following discussions, the term BeZnO alloy is used to refer to $Be_xZn_{1-x}O$ alloy, wherein the atomic fraction x of Be varies from 0 to 1, or as it may be specified.

In an alternate notation, the term BeZnO alloy is used herein to refer to $Be_xZn_{1-x}O$ alloy, wherein $0 \leq x \leq 1$, or as it may be specified.

Similarly, the term ZnCdOSSe alloy is used to refer to $Zn_{1-y}Cd_yO_{1-z-w}S_wSe_z$, alloy, wherein the atomic fraction y of Cd varies from 0 to 1 and the atomic fraction z of Se and the atomic fraction of w of S varies from 0 to 1, independently, as values for y, z and w may each be specified.

In an alternate notation, the term ZnCdOSSe alloy is used herein to refer to $Zn_{1-y}Cd_yO_{1-z-w}S_wSe_z$, alloy, wherein $0 \leq y \leq 1$, $0 \leq z \leq 1$, and $0 \leq w \leq 1$, independently, as values for y, z and w may each be specified.

The energy band gap modulated materials should have high crystalline quality so that semiconductor devices fabricated from these materials have high performance characteristics. ZnO and ZnO alloy materials that are used to fabricate semiconductor devices with high function, capability and performance require a growth process with function and capability for proper control of film growth, composition, and quality and capability for growing undoped material, p-type semiconductor material, and n-type semiconductor material and for growth of layers and heterostructures using these layers.

The Applicants' HBD Technique:

In this regard, the Applicants previously developed a Hybrid Beam Deposition (HBD) process that enabled, among other aspects, the growing of p-type ZnO using an external As-molecular beam to incorporate As-dopant into the film rather than by As-diffusion. This HBD process is described in commonly-owned Patent Applications U.S. 60/406,500, PCT/US03/27143 and U.S. Ser. No. 10/525,611, filed Aug. 28, 2002, Aug. 27, 2003 and Feb. 23, 2005, respectively, each and all of which is/are hereby incorporated by reference.

The Applicants' HBD process for producing As-doped p-type ZnO films can be used to precisely control the doping level. The optical and electrical properties of ZnO:As grown by HBD are discussed in the above-cited, commonly owned patent applications incorporated herein by reference. In particular, hole carrier concentrations sufficiently high for semiconductor layers and structures and for device fabrication can be obtained. The thermal binding energy of the As-acceptor ($E_A^{th-b}$) is 129 meV, as derived from temperature-dependent Hall Effect measurements. The PL spectra reveal two different acceptor levels ($E_A^{opt-b}$), located at 115 and 164 meV, respectively, above the maximum of the ZnO valence band, and also show the binding energy of the exciton to the As-acceptor (EAXb) is about 12 meV. The quality of p-type ZnO:As layers grown by HBD are sufficiently high for device fabrication.

The Applicants' Related Zinc Oxide Films and Structures:

The Applicants also note that wide band gap semiconductor materials have utility for device operation at high temperatures. Zinc oxide is a wide band gap material, and it also possesses good radiation resistance properties. Wide band gap semiconductor films of zinc oxide are now available in both n-type and p-type carrier types that have properties sufficient for fabrication of semiconductor devices.

By way of example, U.S. Pat. No. 6,291,085 (White et al.) discloses a p-type doped zinc oxide film, and wherein the film could be incorporated into a semiconductor device including an FET.

U.S. Pat. No. 6,342,313 (White et al.) discloses a p-type doped metal oxide film having a net acceptor concentration of at least about $10^{15}$ acceptors/cm$^3$, wherein the film is an oxide compound of an element selected from the groups consisting of Group 2 (beryllium, magnesium, calcium, strontium, barium and radium), Group 12 (zinc, cadmium and mercury), Group 2 and 12, and Group 12 and Group 16 (oxygen, sulfur, selenium, tellurium and polonium) elements, wherein the p-type dopant is an element selected from the groups consisting of Group I (hydrogen, lithium, sodium, potassium, rubidium, cesium and francium), Group II (copper, silver and gold), Group 5 (vanadium, niobium and tantalum) and Group 15 (nitrogen, phosphorous, arsenic, antimony and bismuth) elements.

U.S. Pat. No. 6,410,162 (White et al.) discloses a p-type doped zinc oxide film wherein the p-type dopant is selected from Group 1, 11, 5 and 15 elements, and wherein the film can be incorporated into a semiconductor device including an FET, or into a semiconductor device as a substrate material for lattice matching to materials in the device.

The above-referenced patents and disclosures, including the above-referenced U.S. Pat. Nos. 6,291,085; 6,342,313 and 6,410,162, are incorporated by reference herein.

The Applicants' HBD process, as noted above and described in the cited, commonly owned patent documents incorporated herein by reference, enables the production of high quality semiconductor material including, but not limited to, undoped ZnO, p-type doped ZnO, n-type doped ZnO, undoped ZnBeO alloys, p-type doped ZnBeO alloys, n-type doped ZnBeO alloys, undoped ZnCdOSSe alloys, p-type doped ZnCdOSSe alloys, n-type doped ZnCdOSSe alloys.

The Applicants also note the following additional aspects, with relevance to the present invention as described in detail below:

ZnO and BeO are Group II-VI compounds with energy band gap values of 3.3 eV and 10.6 eV, respectively. ZnO has a hexagonal crystal structure when grown under proper conditions. BeO has a hexagonal crystal structure when grown under proper conditions. From a consideration of Vernard's Law, ZnO and BeO can be mixed in a proper ratio to attain a particular energy band gap value between approximately 3.3 eV and approximately 10.6 eV. More specifically, according to Vernard's Law, the energy band gap for the alloy $Zn_{0.9}Be_{0.1}O$ should be greater than the approximately 3.3 eV for ZnO by the amount of approximately 0.73 eV.

ZnO and CdSe are Group II-VI compounds with energy band gap values of approximately 3.3 eV and approximately 1.75 eV, respectively. CdSe has a hexagonal crystal structure when grown under proper conditions. From a consideration of Vernard's Law, ZnO and CdSe can be mixed in a proper ratio to attain a particular energy band gap value between approximately 3.3 eV and approximately 1.75 eV.

ZnO and CdS are Group II-VI compounds with energy band gap values of approximately 3.3 eV and approximately 2.41 eV, respectively. CdS has a hexagonal crystal structure when grown under proper conditions. From a consideration of Vernard's Law, ZnO and CdS can be mixed in a proper ratio to attain a particular energy band gap value between approximately 3.3 eV and approximately 2.41 eV.

ZnO and ZnSe are Group II-VI compounds with energy band gap values of approximately 3.3 eV and approximately 2.8 eV, respectively. ZnSe has a hexagonal crystal structure when grown under proper conditions. From a consideration of Vernard's Law, ZnO and ZnSe can be mixed in a proper ratio to attain a particular energy band gap value between approximately 3.3 eV and approximately 2.8 eV.

An epitaxially layered material with an energy band gap between approximately 10.6 and approximately 3.3 eV can be designed, wherein the material can be undoped, p-type doped, or n-type doped.

An epitaxially layered material with an energy band gap between approximately 1.75 eV and approximately 3.3 eV can be designed, wherein the material can be undoped, p-type doped, or n-type doped.

The power, efficiency, function and speed of a semiconductor device is limited by the mobility of carriers, either n-type or p-type, in the semiconductor device. The availability of SL, DH, QW and MQW structures for use in ZnO devices can be used to increase the performance, capability and function of a semiconductor device.

Additional information, and other methods, devices, techniques and practices in this area of technology, are described in the Applicants' patent application Serial No. PCT/US03/27143 filed Aug. 27, 2003, U.S. Ser. No. 10/525,611 filed Feb. 23, 2005, Ser. No. 11/339,299 filed Jan. 25, 2006, Ser. No. 11/394,382 filed Mar. 29, 2006 and Ser. No. 11/295,686 filed Dec. 6, 2005, each incorporated herein by reference as if set forth herein in its entirety.

EXAMPLES AND EMBODIMENTS OF THE INVENTION

With the foregoing discussion in mind, the following is a detailed description of various embodiments and examples of the present invention.

Figure 2:
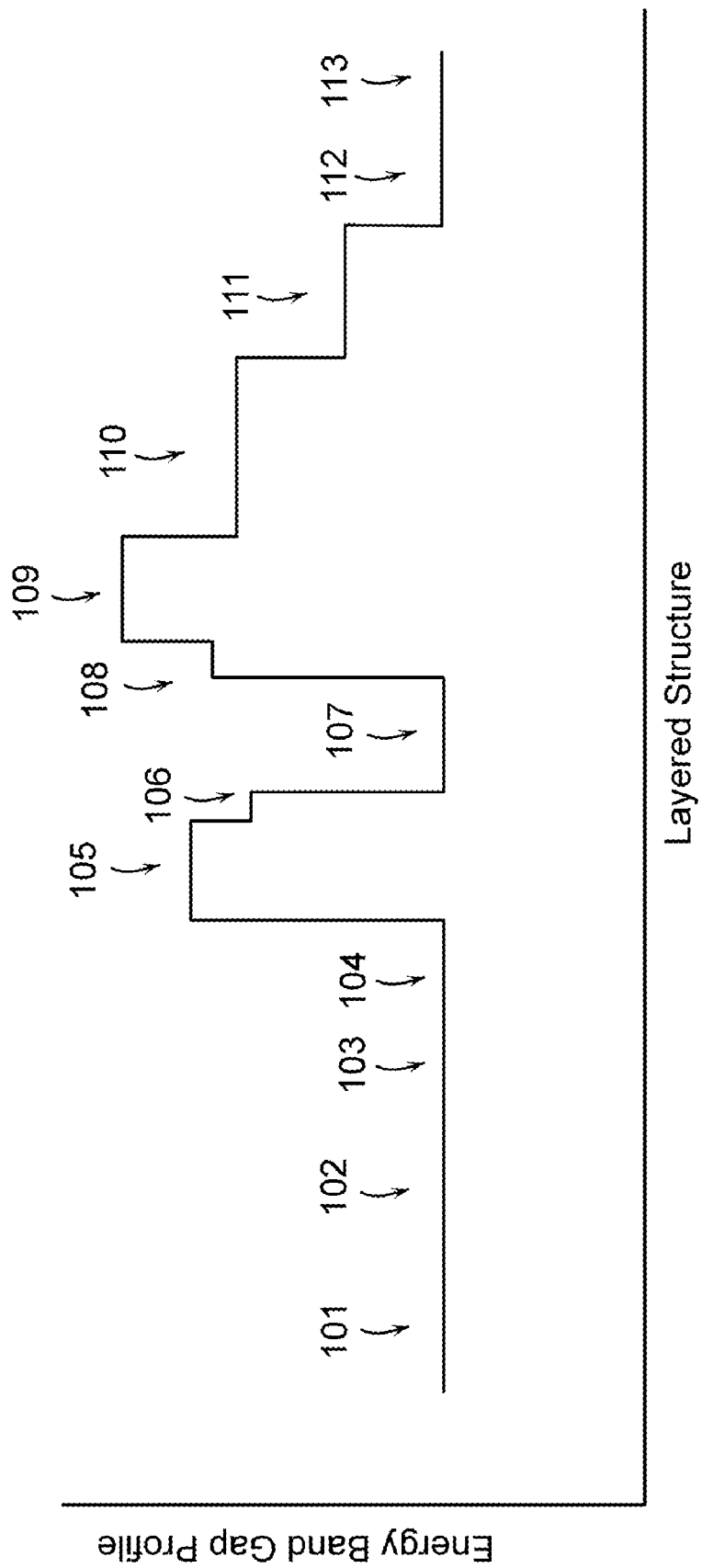
FIG. 2 is a schematic showing the relative values of the energy band gaps for the semiconductor device of FIG. 1.

FIG. 1 is a schematic diagram showing a ZnO based LED semiconductor device in accordance with the invention. In the example of FIG. 1, the illustrated embodiment comprises a BeZnO alloy based semiconductor device grown on an n-type ZnO single crystal substrate. FIG. 2 illustrates the relative energy band gap values for the device shown in FIG. 1.

In one example, the device 100 shown in FIG. 1 comprises:
an electrode (101);
an n-type ZnO single crystal substrate (102);
a 50 nm thick ZnO buffer layer (103);
a 30 nm thick n-type ZnO semiconductor layer doped with Ga (104);
a 30 nm thick n-type BeZnO semiconductor first cladding layer doped with Ga (105), wherein the energy band gap energy is higher than the energy band gap of the previously formed 30 nm thick n-type ZnO semiconductor layer doped with Ga;
a 10 nm thick n-type BeZnO semiconductor first barrier layer doped with Ga (106), wherein the energy band gap is lower than the energy band gap of the n-type BeZnO semiconductor first cladding layer and higher than the energy band gap of the undoped ZnO semiconductor active layer;
a 30 nm thick undoped ZnO semiconductor active layer (107);
a 10 nm thick p-type BeZnO semiconductor second barrier layer doped with As (108), wherein the energy band gap is higher than the energy band gap of the undoped ZnO semiconductor active layer;
a 30 nm thick p-type BeZnO semiconductor second cladding layer doped with As (109), wherein the energy band gap is higher than the energy band gap of the p-type BeZnO semiconductor second barrier layer, and higher than the energy band gap of the n-type BeZnO semiconductor first cladding layer;
a 70 nm thick p-type BeZnO semiconductor layer doped with As (110), wherein the energy band gap is lower than the energy band gap of the p-type BeZnO semiconductor second cladding layer doped with As, and higher than the energy band gap of the undoped ZnO semiconductor active layer;
a 50 nm thick p-type BeZnO semiconductor layer doped with As (111), wherein the energy band gap is lower than the energy band gap of the 70 mm thick p-type BeZnO semiconductor layer doped with As, and higher than the energy band gap of the undoped ZnO semiconductor active layer,
an electrical contact layer (112) on the outermost surface of the 50 nm thick p-type BeZnO semiconductor layer, and
an electrode (113) on the exposed surface of the electrical contact layer (112) for enabling an electrical connection to the device.

In one example, each of the ZnO and BeZnO semiconductor layers is deposited using, by way of example, the HBD process for film growth.

For descriptive purposes, the 30 nm thick undoped ZnO semiconductor layer is the active layer, the two adjacent 10 nm thick BeZnO layers are first and second barrier layers, and the two 30 nm thick BeZnO layers are first and second cladding layers. The barrier and cladding layers aid in confinement of electrical carriers to the active layer region.

In one example in accordance with the embodiment illustrated in FIG. 1, the n-type single crystal substrate is a substrate selected from the list consisting of, but not limited to, n-type ZnO, n-type GaN, n-type SiC and n-type silicon. (The use of other materials, and the use of a substrate other than a single crystal substrate, are also described herein.)

In one example in accordance with the embodiment illustrated in FIG. 1, the active emission layer is comprised of an active emission region selected from the list consisting of, but not limited to, a single quantum well (QW) structure, multiple quantum well structure (MQW), or a double heterostructure (DH).

In various practices or examples of the invention, analogous to the embodiment illustrated in FIG. 1:

1) The active emission layer can be an undoped or doped ZnO layer.

2) The active emission layer can be an undoped or doped ZnCdOSSe based alloy layer.

3) The active emission layer can be all undoped or doped BeZnO based alloy layer.

4) The active emission layer can comprise an active emission region that is an undoped or doped ZnCdOSSe based alloy and the active emission region may be either a single quantum well (QW) structure, multiple quantum well structure (MQW), or a double heterostructure (DH).

5) The active emission layer can comprise an active emission region that is an undoped or doped BeZnO based alloy and the active emission region may be either a single quantum well (QW) structure, multiple quantum well structure (MQW), or a double heterostructure (DH).

6) The buffer layer may be either ZnO or n-type doped ZnO when deposited on an n-type substrate.

7) The buffer layer may be either ZnO or p-type doped ZnO when deposited on a p-type substrate.

8) The buffer layer region may be omitted, or other variations in the structure of the device can be employed, as described elsewhere in this document While the foregoing examples and embodiments of the present invention are described with respect to a ZnO active layer, it will be understood that the present invention may be practiced with respect to an active layer comprised of other structures, such as, but not limited to, QW, MQW, or a double heterostructure, and to other types of doped and undoped ZnO alloys, such as, but not limited to, doped and undoped ZnCdOSSe and BeZnO alloys.

The energy band gap value of the ZnCdOSSe alloy film of the invention can be varied from approximately 3.3 eV to approximately 1.75 eV, more or less, by adjusting, independently, the atomic fraction of Cd and the atomic fraction of Se from 0 to 1 in the ZnCdOSSe alloy.

The energy band gap value of the ZnCdOSSe alloy film of the invention can be varied from approximately 3.3 eV to approximately 1.75 eV, more or less, by adjusting, independently, the atomic fraction of Cd, the atomic fraction of S, and the atomic fraction of Se from 0 to 1 in the ZnCdOSSe alloy.

Those skilled in the art will appreciate that in accordance with the invention, and analogous to the examples of FIG. 1 and FIG. 2, many variations are possible and are within the scope of the invention. Such variations can include, by way of example, any or combinations of the following (and still other variations are described elsewhere in this document):

1) n-type ZnO based semiconductor materials can be prepared wherein the n-type dopant is an element, or more than one element, selected from the group consisting of boron, aluminum, gallium, indium, thallium, fluorine, chlorine, bromine and iodine;

2) p-type ZnO based semiconductor materials can be prepared wherein the p-type dopant is an element, or more than one element, selected from the Group 1, 11, 5 and 15 elements;

3) p-type ZnO based semiconductor materials can be prepared wherein the p-type dopant is selected from the group consisting of arsenic, phosphorus, antimony, nitrogen, and bismuth;

4) p-type ZnO based semiconductor materials can be prepared wherein the p-type dopant is arsenic;

5) n-type ZnCdOSSe semiconductor alloy material can be prepared wherein the n-type dopant is an element, or more than one element, selected from the group consisting of boron, aluminum, gallium, indium, thallium, fluorine, chlorine, bromine and iodine;

6) p-type ZnCdOSSe semiconductor alloy material can be prepared wherein the p-type dopant is an element, or more than one element, selected from the Group 1, 11, 5 and 15 elements;

7) p-type ZnCdOSSe semiconductor alloy material can be prepared wherein the p-type dopant is selected from the group consisting of arsenic, phosphorus, antimony, nitrogen and bismuth;

8) p-type ZnCdOSSe semiconductor alloy material can be prepared wherein the p-type dopant is arsenic.

9) BeZnO semiconductor material can be grown with an atomic fraction of Mg incorporated into the BeZnO material for applications to form lattice matched layers wherein the BeZnO film can be either undoped, p-type doped, or n-type doped semiconductor material;

10) n-type BeZnO semiconductor material can be prepared wherein the n-type dopant is an element, or more than one element, selected from the group consisting of boron, aluminum, gallium, indium, thallium, fluorine, chlorine, bromine and iodine;

11) p-type BeZnO based semiconductor materials can be prepared wherein the p-type dopant is an element, or more than one element, selected from the Group 1, 11, 5 and 15 elements;

12) p-type BeZnO based semiconductor materials can be prepared wherein the p-type dopant is selected from the group consisting of arsenic, phosphorus, antimony, nitrogen, and bismuth;

13) p-type BeZnO based semiconductor materials can be prepared wherein the p-type dopant is arsenic;

14) a DBR, either n-type doped or p-type doped, may be grown on the buffer layer;

15) a DBR, either n-type doped or p-type doped, may be grown on the second cladding layer;

16) a DBR may be grown on both the buffer layer and on the second cladding layer;

17) a metallic reflector-electrical contact layer may be grown on the second cladding layer, the exposed face of the substrate, or on both;

18) a semiconductor slab may be formed with mirrors on each end to form a laser cavity for an edge emitting laser with the barrier and cladding layers serving as optical waveguides;

19) a semiconductor device can be fabricated wherein the active layer region contains one, or more than one, active layer;

20) a semiconductor device can be fabricated wherein the active layer region contains one, or more than one, active layer material;

21) a semiconductor device can be fabricated wherein the active layer region contains active layers having different semiconductor materials that are selected from the list consisting of, but not limited to, ZnO, BeZnO alloys, and ZnCdOSSe alloys.

Example of Manufacture

In one such example, a polished n-type ZnO wafer cut from a bulk crystal was used as the substrate. The wafer was placed in a hybrid beam deposition reactor, and heated to approximately 750° C. The pressure was reduced to approximately $1 \times 10^{-5}$ Torr and the substrate cleaned with RF oxygen plasma for 30 minutes. The temperature was then lowered to 630° C., and then onto the substrate a buffer layer of ZnO was deposited to approximately 50 nm thickness. Then a layer of n-type ZnO doped with Ga was deposited to approximately 30 nm thickness on the buffer layer. During the deposition of the n-type ZnO semiconductor film a thermally controlled Knudsen cell containing Ga was heated to produce a beam of Ga vapor that impinged on the substrate simultaneous with the beams used to grow ZnO. Then, onto the 30 nm n-type ZnO film a layer of n-type BeZnO doped with Ga was deposited to approximately 30 nm thickness. During the deposition of the n-type BeZnO semiconductor alloy film a thermally controlled Knudsen cell containing Ga was heated to produce a beam of Ga vapor that impinged on the substrate simultaneous with the beams used to grow ZnO and a thermally controlled Knudsen cell containing Be was heated to produce a beam of Be vapor that impinged on the substrate simultaneous with the beams used to grow ZnO. Then, on the n-type BeZnO film a layer of n-type BeZnO was deposited to approximately 10 nm thickness with Be atomic fraction slightly less than the Be atomic fraction in the 30 nm film onto which it was deposited. Then, on the 10 nm n-type BeZnO semiconductor alloy film a layer of undoped ZnO semiconductor film was then deposited to approximately 30 nm thickness. Then, on the undoped ZnO semiconductor film a layer of p-type BeZnO doped with As was deposited to approximately 10 nm thickness. During the deposition of the p-type BeZnO semiconductor alloy film a thermally controlled Knudsen cell containing As was heated to produce a beam of As vapor that impinged on the substrate simultaneous with the beams used to grow ZnO and a thermally controlled Knudsen cell containing Be was heated to produce a beam of Be vapor that impinged on the substrate simultaneous with the beams used to grow ZnO. Then, on the 10 nm p-type BeZnO semiconductor film a layer of p-type BeZnO doped with As was deposited to approximately 30 nm thickness with Be atomic fraction greater than the Be atomic fraction in the 10 nm p-type BeZnO film onto which it was deposited and also greater than the 30 nm n-type BeZnO film deposited earlier. Then, on the 30 nm p-type BeZnO semiconductor film a layer of p-type BeZnO doped with As was deposited to approximately 70 nm thickness with Be atomic fraction less than the Be atomic fraction in the 30 nm p-type BeZnO onto which it was deposited. Then, on the 70 nm p-type BeZnO semiconductor film a layer of p-type BeZnO doped with As was deposited to approximately 50 nm thickness with Be atomic fraction less than the Be atomic fraction in the 70 nm p-type BeZnO film onto which it was deposited.

(A more detailed description of exemplary hybrid beam deposition (HBD) processes for depositing a zinc oxide layer, an n-type zinc oxide layer, and a p-type zinc oxide layer, and in particular a p-type zinc oxide layer doped with arsenic, is set forth in one or more of commonly owned U.S. Pat. Nos. 6,475,825 and 6,610,141, and Patent Applications U.S. 60/406,500, PCT/US03/27143 and U.S. Ser. No. 10/525,611, each and all of which is/are hereby incorporated by reference as if set forth in their entireties herein.)

The temperature of the HBD chamber was reduced to room temperature and the wafer with deposited layers was removed from the reactor.

Then, an electrode for the positive electrical contact was formed on the topmost surface of the p-type BeZnO layer. An electrode for use as the negative terminal was formed on the outer surface of the n-type single crystal ZnO substrate.

The current-voltage (I-V) electrical characteristics and the optical power output of devices formed on the wafer were measured using a semiconductor parameter analyzer.

Cladding Layers

FIG. 2 illustrates the relative energy band gap values for the device shown in FIG. 1. The ZnO layer is the active layer. The two layers with 10 nm thicknesses adjacent to the active layer are first and second barrier layers, and the 30 nm layers adjacent to each of the 10 nm layers are first and second cladding layers. The barrier and cladding layers aid in confining electrical carriers to the active layer region.

Current-Voltage Data

Figure 3:
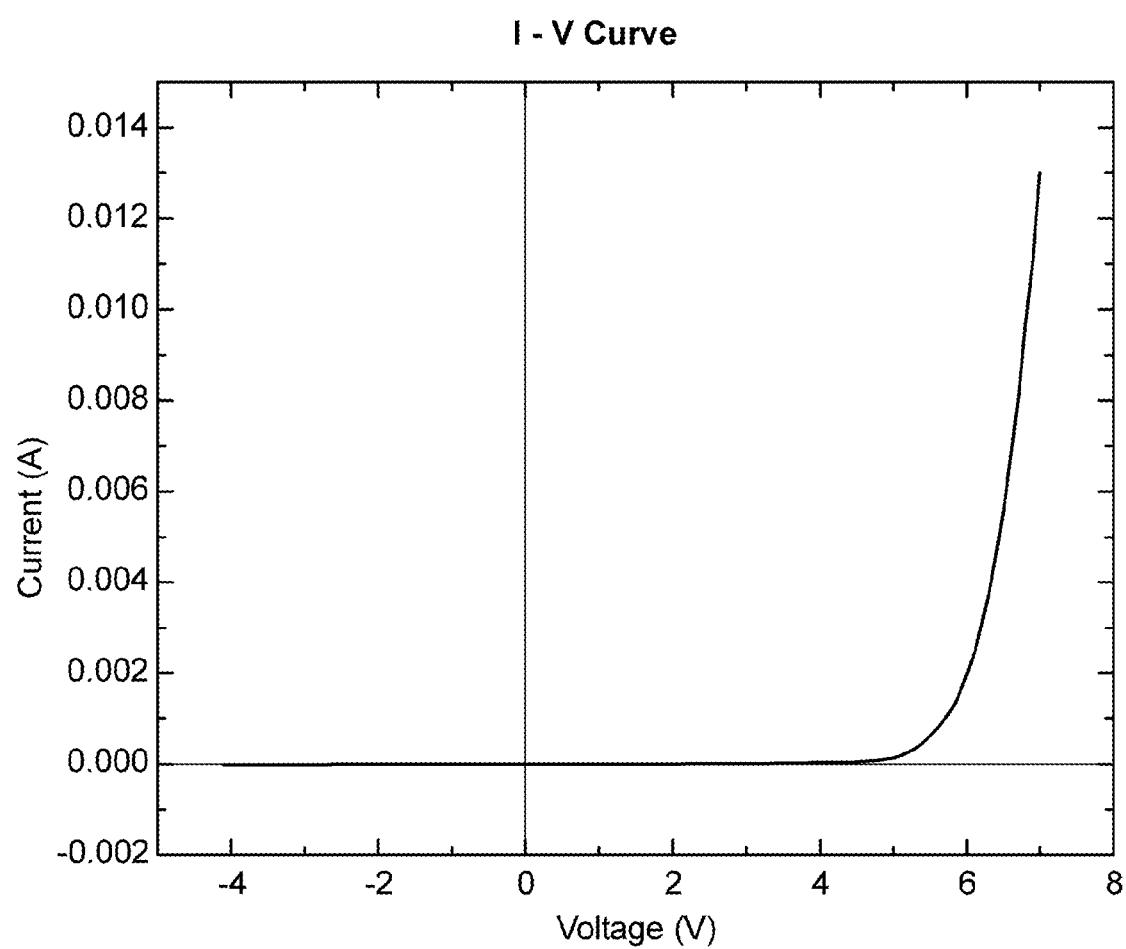
FIG. 3 shows data for an example I-V curve for the device of FIG. 1.

FIG. 3 shows an I-V curve; namely, current (I) in arbitrary units (a. u.) versus voltage in wavelength in units of volts (V), for a device of the type illustrated in FIG. 1.

Optical Output Spectrum

Figure 4:
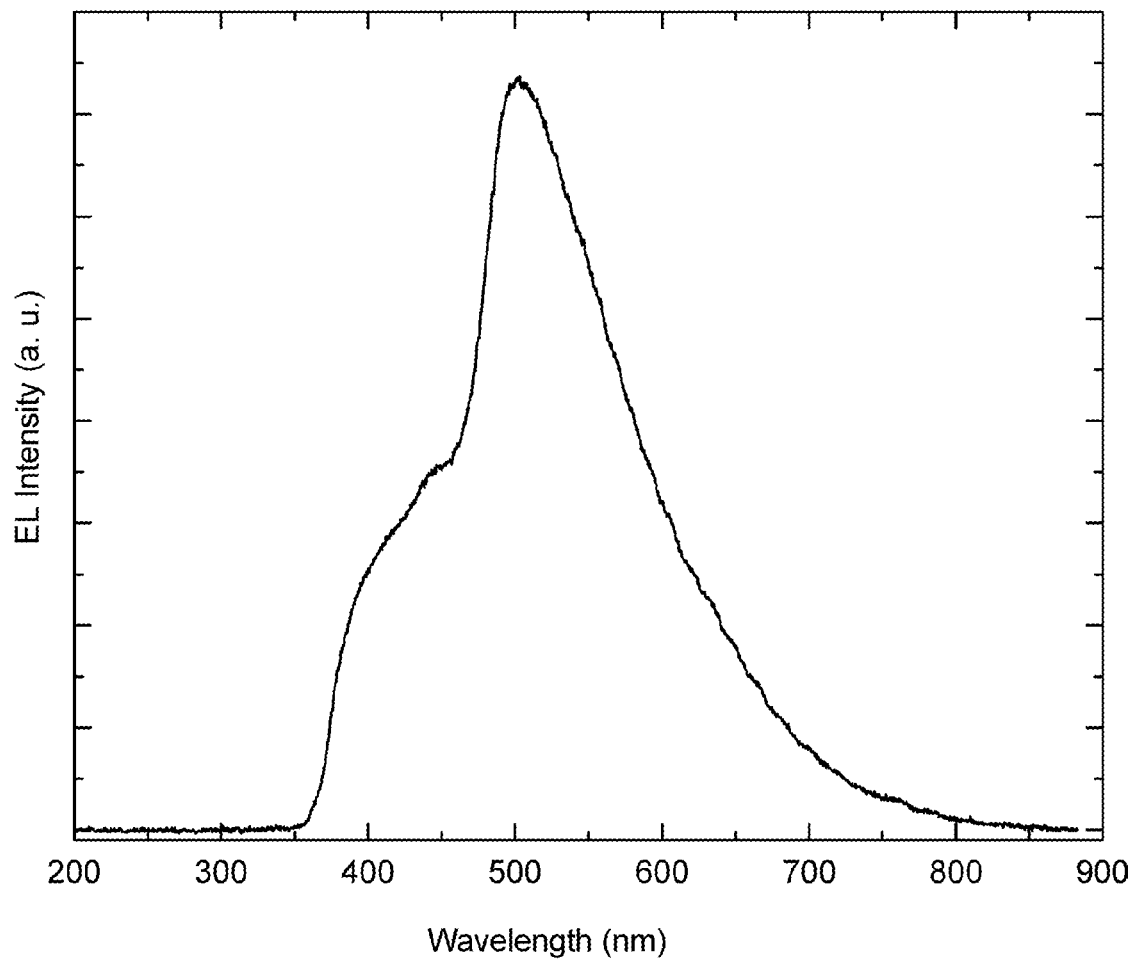
FIG. 4 shows a measured spectral output spectral curve for the device of FIG. 1.

FIG. 4 shows spectral output versus wavelength; namely, electro-luminescent (EL) intensity in arbitrary units (a. u.) versus wavelength in units of nm, emitted through the topmost surface for a device of the type illustrated in FIG. 1. Referring to FIG. 4, if a substantial portion of the light generated in the active layer of the semiconductor device of FIG. 1 is to be extracted through the substrate, then the negative electrode should be of a design that facilitates light extraction through the substrate while providing good electrical contact. A mirror layer can be added to the topmost p-type BeZnO semiconductor layer to increase the efficiency for extraction of light through the substrate.

Flip-Chip Mounting

As noted above, if a substantial portion of the light generated in the active layer of the semiconductor device of FIG. 1 is to be extracted through the substrate, then the negative electrode should be of a design that facilitates light extraction through the substrate while providing good electrical contact. A flip-chip mounting structure facilitates light extraction through the substrate while providing good electrical contacts. A number of suitable designs are possible for such an electrode.

Figure 5:
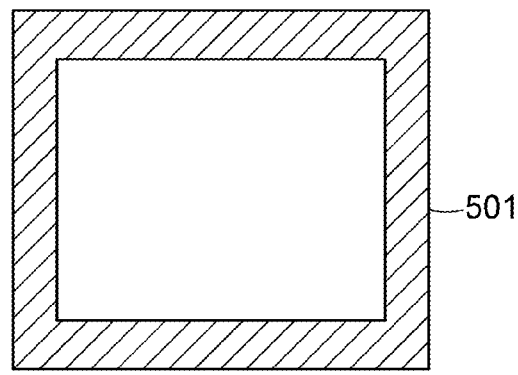
FIG. 5 is a schematic showing the electrode pattern (hatched area) for the negative electrical electrode on the substrate for the semiconductor device shown in FIG. 1 that would facilitate light extraction through the substrate while providing good electrical contact.

FIG. 5 is a schematic showing one possible electrode pattern (hatched area 501) for a negative electrical connection to the substrate for the semiconductor device shown in FIG. 1 that facilitates light extraction through the substrate while providing good electrical contact. Alternate patterns that could be used include a pattern that include, but are not limited to, a square or a circle located in the center of the exposed surface substrate that would occupy a small fraction of the total area of the substrate, for example about 10%.

Figure 6:
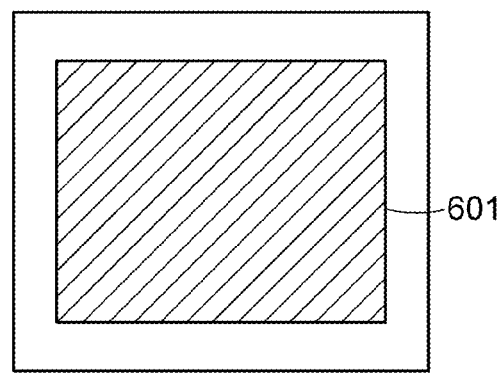
FIG. 6 is a schematic showing the electrode pattern (hatched area) for a positive electrical electrode on the semiconductor device shown in FIG. 1 that allows the device to be mounted in flip-chip geometry and provide good contact to a soft metal bump.

FIG. 6 is a schematic showing the electrode pattern (hatched area 601) for a positive electrode for electrical connection to the semiconductor device of FIG. 1 that allows the device to be mounted in flip-chip geometry and to maintain good electrical contact with the topmost surface of the device (such as via a soft metal bump).

Figure 7:
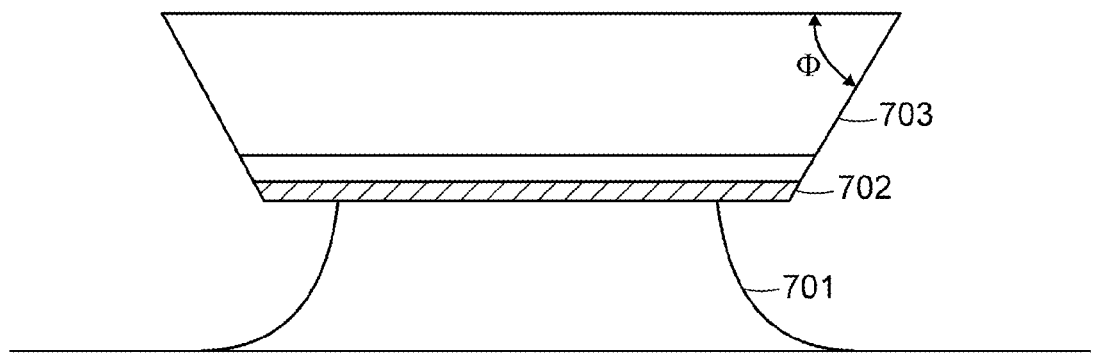
FIG. 7 illustrates a ZnO based LED device of the type shown in FIG. 1 in a flip-chip mounting structure.

FIG. 7 is a schematic of the semiconductor device ("C") of FIG. 1 in a flip-chip arrangement that illustrates a method for attachment of a positive electrical connection to an indium (In) bump (701). The negative electrical connection can be made to an electrode (702) located on the exposed face of the substrate. Substrate edges form an angle ø with respect to the exposed substrate surface, where the value of ø can be selected to be value in the range 90°≦ø≦10° to maximize the efficiency of light extraction from the device (703). Other angles can be selected, whether substantially 90 degrees, less than substantially 90 degrees, or greater than substantially 90 degrees.

Figure 8:
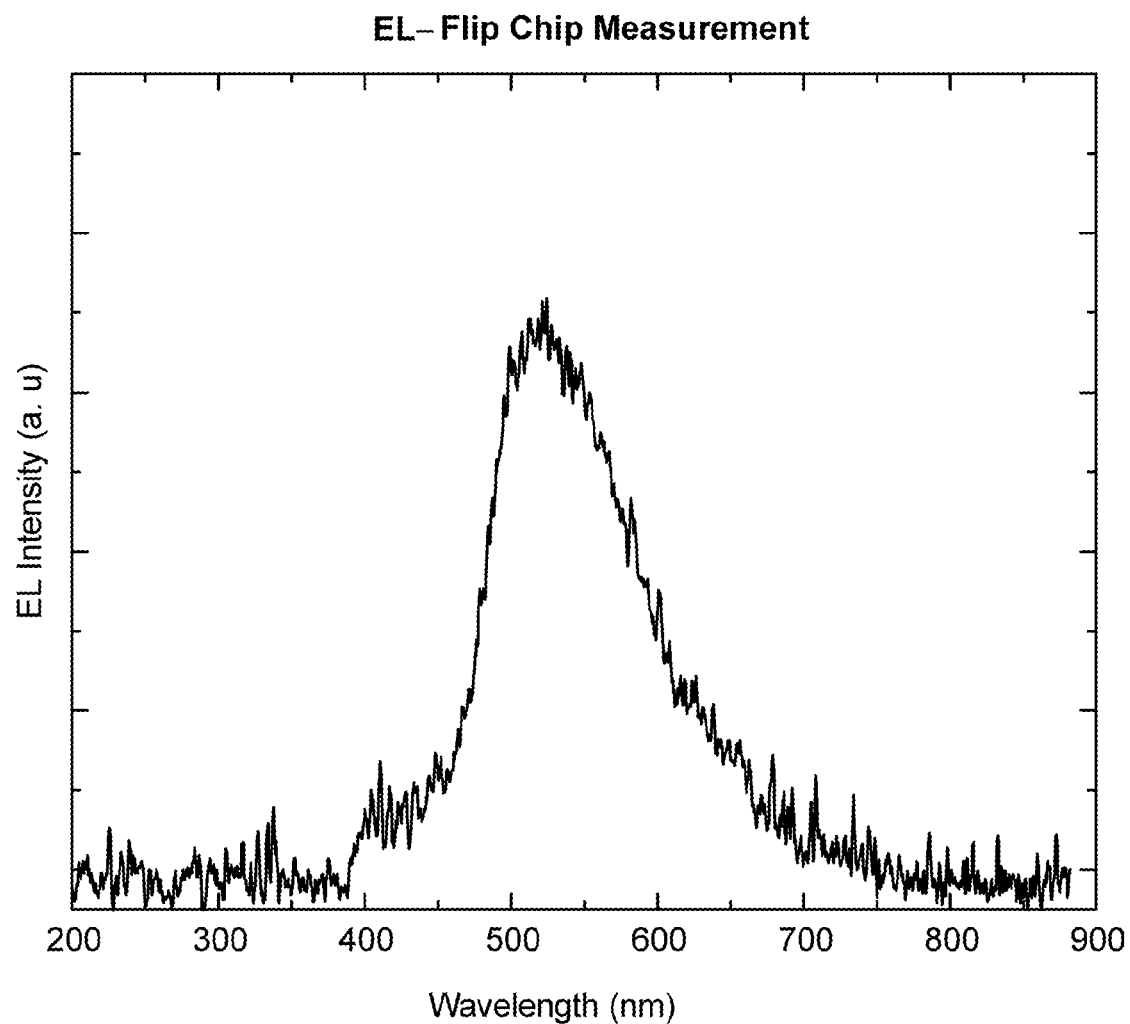
FIG. 8 shows spectral output versus wavelength; namely, electro-luminescence (EL) intensity in arbitrary units (a. u.) versus wavelength in units of nm, emitted through the substrate surface for a device of the type illustrated in FIG. 1 mounted as a flip-chip with ø=90°.

FIG. 8 shows spectral output versus wavelength; namely, electro-luminescence (EL) intensity in arbitrary units (a. u.) versus wavelength in units of nm, emitted through the substrate surface for a device of the type illustrated in FIG. 1 mounted as a flip-chip with ø=90°. Electro-luminescence (EL) is light emission generated by electrical excitation; for example, the spectral output generated when a voltage is applied to the electrodes of a light emitting device.

Stimulated Emission of Radiation

In accordance with the invention, the light emitting semiconductor device shown in FIG. 1 demonstrated stimulated emission of radiation for electrical excitation; namely, by application of a voltage difference to the device electrodes. This stimulated emission occurred in addition to the spontaneous emission that is normally observed for LED devices.

The presence of light amplification by the stimulated emission of radiation (lasing) is characterized by one or more spectral lines, each spectral line having very narrow linewidth and a spectral line intensity that stands above the intensity for spontaneous emission. It is necessary to have a cavity with reflecting ends, of some type, for optical gain to occur, and for the device to operate above a minimum threshold current density for the device.

For a device shown in FIG. 1, the cavity can be formed by interfaces associated with the various semiconductor layers. The various cavities formed for the device shown in FIG. 1 are far from ideal, in part due to length and in part due to lack of good reflection surfaces.

Photo-luminescence (PL) is light emission generated by photon excitation; for example, the spectral output generated when energetic photons are used as the excitation source, as opposed to excitation by a voltage source. PL has been observed for ZnO material.

Figure 9:
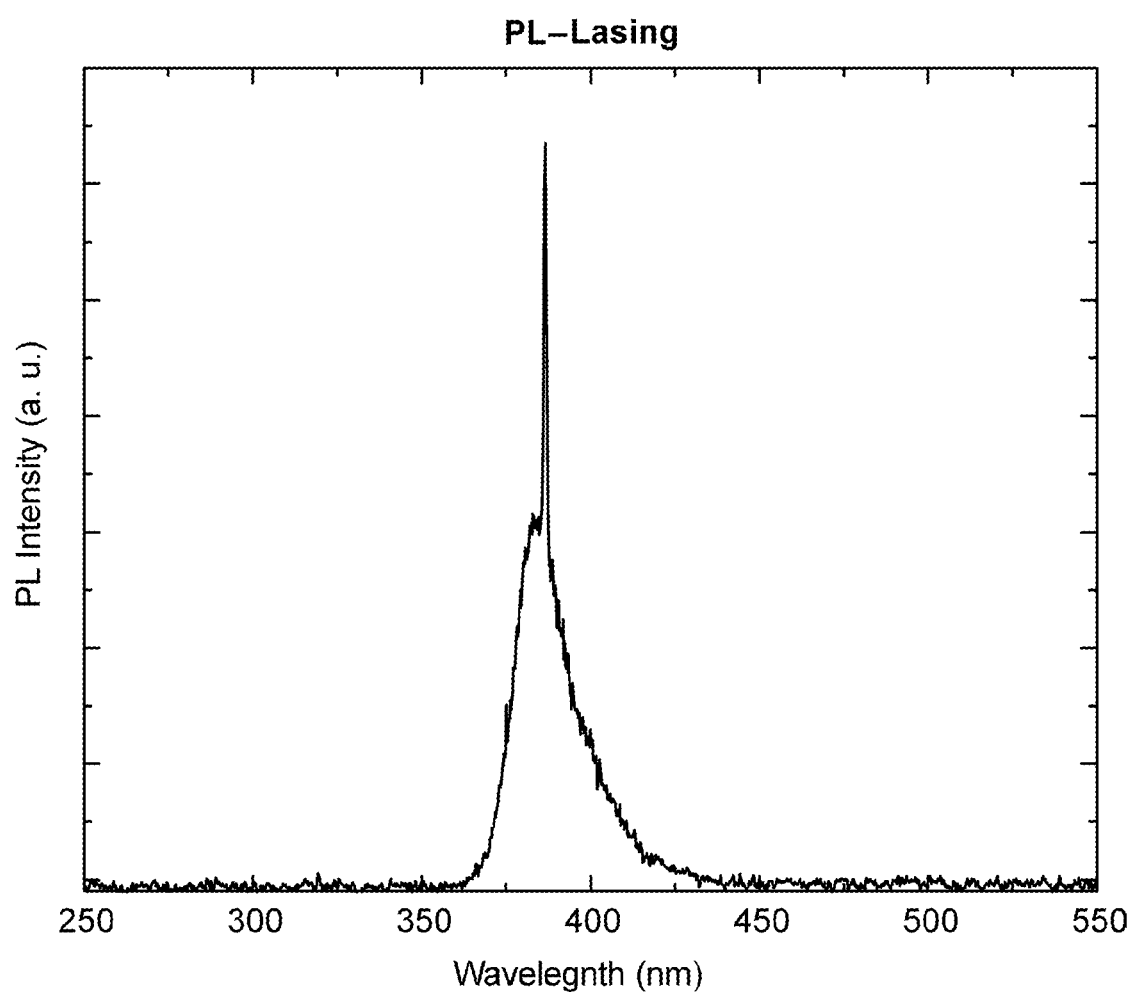
FIG. 9 shows spectral output versus wavelength; namely, photo-luminescence (PL) intensity in arbitrary units (a. u.) versus wavelength in units of nm, emitted from ZnO material grown by the HBD method of the type used for fabrication of the device of FIG. 1.

FIG. 9 shows spectral output versus wavelength; namely, photo-luminescence (PL) intensity in arbitrary units (a. u.) versus wavelength in units of nm, emitted from the topmost surface of a device of the type illustrated in FIG. 1 (which may be grown by the HBD method) during excitation with a pulsed ArF excimer laser source with output wavelength at 193 nm. The high intensity spectral line located 387 nm is a spectral lasing line, and is due to stimulated emission.

Figure 10:
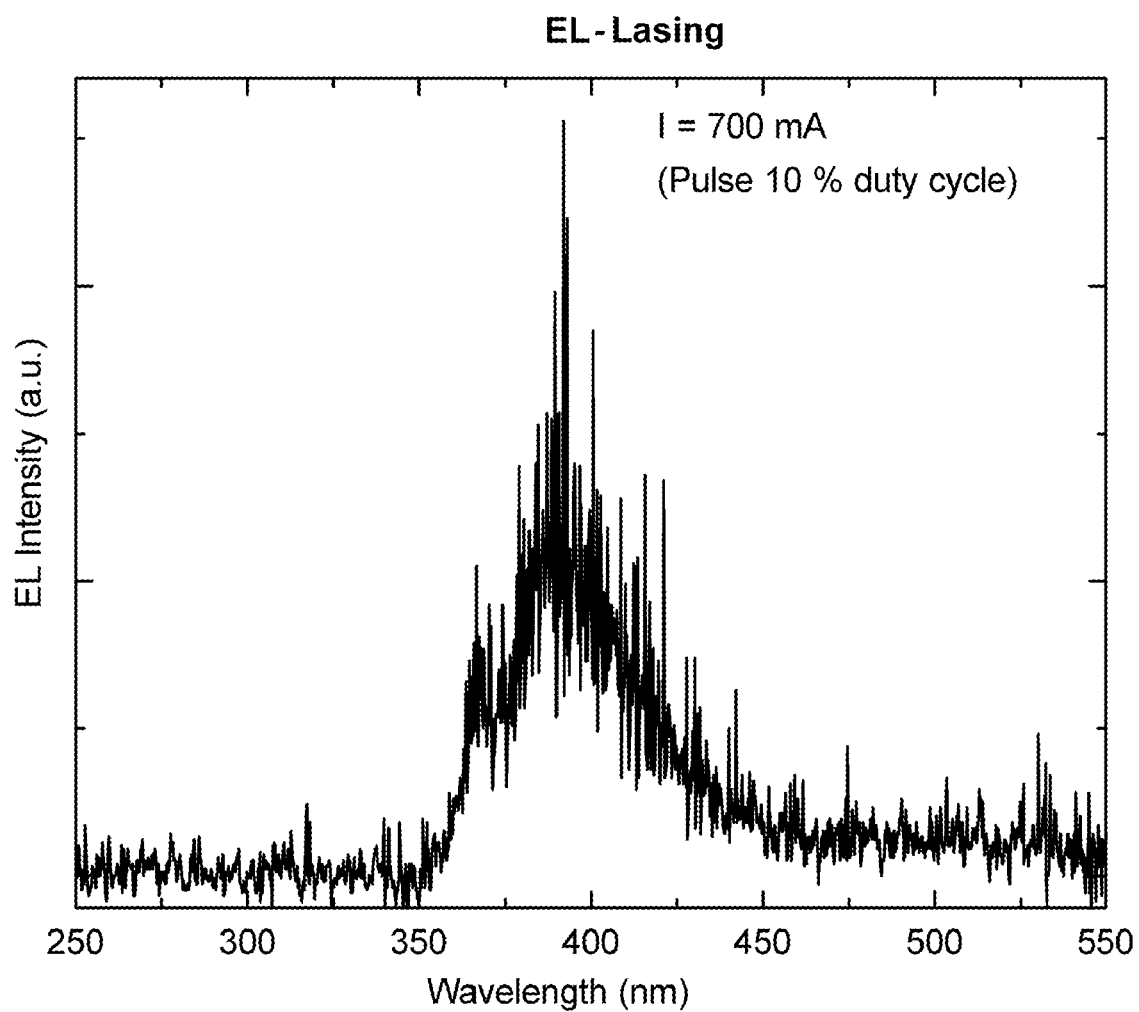
FIG. 10 shows electro-luminescence (EL) intensity in arbitrary units (a. u.) versus wavelength in units of nm, emitted through the topmost surface for a device of the type illustrated in FIG. 1.

FIG. 10 shows electro-luminescence (EL) intensity in arbitrary units (a. u.) versus wavelength in units of nm, emitted through the topmost surface for a device of the type illustrated in FIG. 1. For this measurement, a pulsed I-V mode with 10% duty cycle was used to observe EL intensity at 700 mA, above the threshold current density. More than one lasing spectral line could be observed. The most prominent lasing spectral line is located at 391 nm; namely, at near the same location as the PL spectral lasing line shown in FIG. 9. While not limiting to the present invention, the difference in wavelength locations of these two lines can be ascribed to the differences in time scales due to differences in carrier dynamics for photo-luminescent and electro-luminescent processes.

Two designs that can be employed to fabricated lasers from based on a p-n junction device of the type shown in FIG. 1 are a vertical cavity surface emitting laser (VCSEL) and an edge emitting laser diode—the latter often called a laser diode, LD.

A VCSEL is a semiconductor device whereby two DBRs serve as mirrors for the laser cavity. The length of the spacer region is the combined thickness of the active layer, two barrier layers and two cladding layers. The space layer is typically one wavelength. Laser light is emitted from the top, or alternatively through the substrate, or both surfaces.

An edge emitting laser diode is semiconductor device with slab geometry whereby barrier and cladding layers serve as waveguides. Following removal of the wafer from the HBD system, a narrow slab of wafer material is formed, e.g., by methods such as dicing or cleaving, so that the bottom of the slab would be the substrate and the opposing surface would be the topmost layer of the deposited layers. Mirrors formed at each end, e.g., by methods such as polishing or using a cleaved surface. An edge of the active layer is exposed at the mirror surfaces, with a portion of the cavity radiation emitted through one mirror; hence, the term edge emitting. The length of the cavity is typically several hundred wavelengths. The two electrodes are typically formed immediately above and below the active layer stripe, and typically extend the length of the active layer stripe to promote device efficiency.

Figure 11:
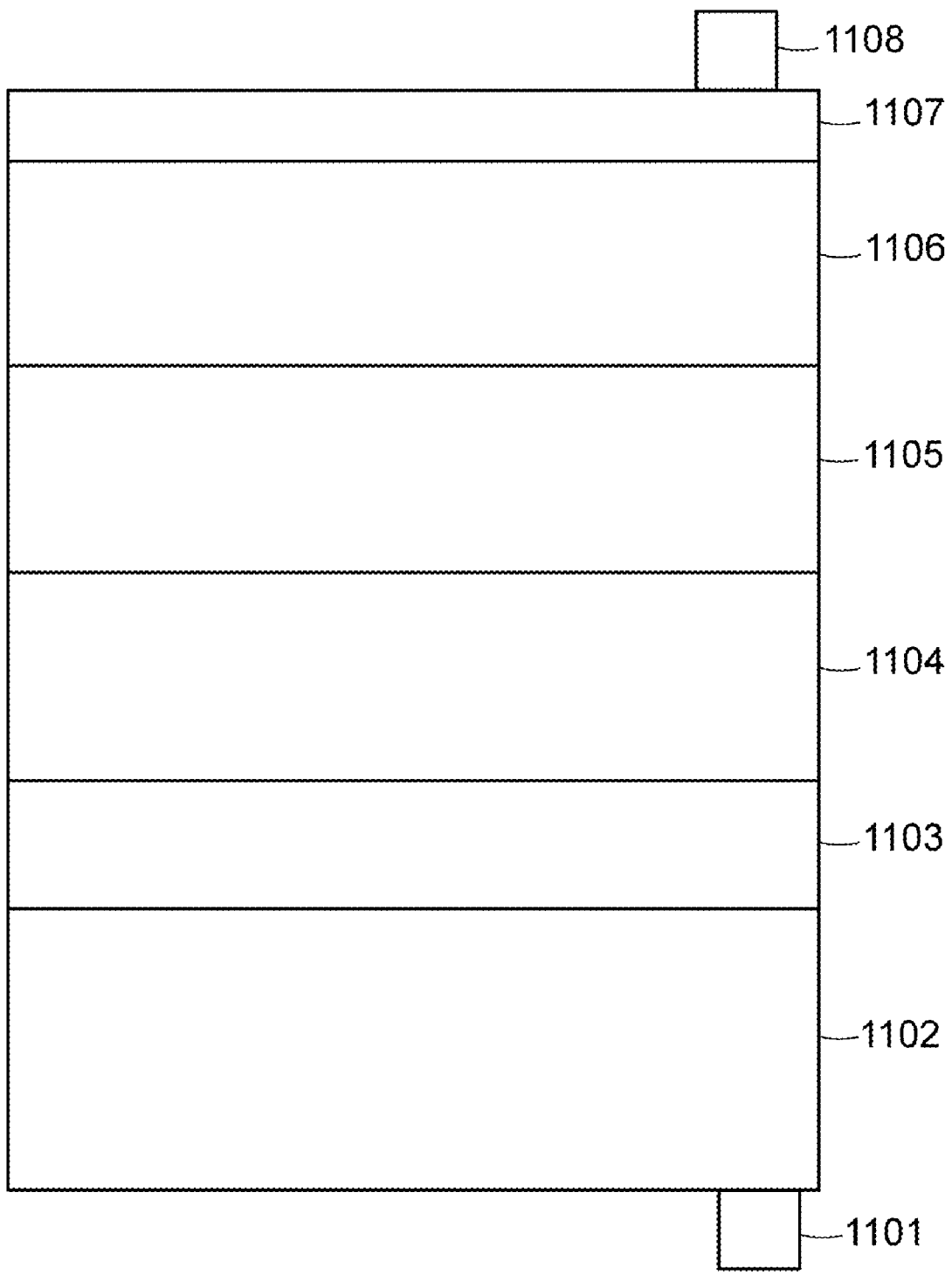
FIG. 11 illustrates a ZnO based vertical cavity surface emitting laser (VCSEL) semiconductor device in accordance with the invention.

FIG. 11 illustrates a ZnO based vertical cavity surface emitting laser (VCSEL) semiconductor device whereby two DBRs serve as mirrors for the laser cavity. The length of the spacer region is the combined thickness of the active layer, two barrier layers and two cladding layers. The space layer is typically one wavelength In particular, FIG. illustrates a ZnO based VCSEL 1100 comprised of an electrode 1101, an n-type ZnO substrate 1102, a 50 nm ZnO buffer layer 1103, an n-type first DBR layer region 1104, a spacer layer region 1105, a p-type second DBR 1106, and a topmost electrical contact layer 1107, with electrodes on the substrate (electrode 1101) and topmost layer (electrode 1108), as labeled and shown.

The spacer layer region contains the active layer, two adjacent barrier layers and two cladding layers. The DBRs are optical reflectors and form the cavity for the VCSEL. The cavity length can be adjusted by varying the total thickness of the spacer layer region—and commonly the thickness is equal to the emission wavelength. Each of the semiconductor alloy layers has been deposited using, by way of example, the HBD process for film growth.

Figure 12:
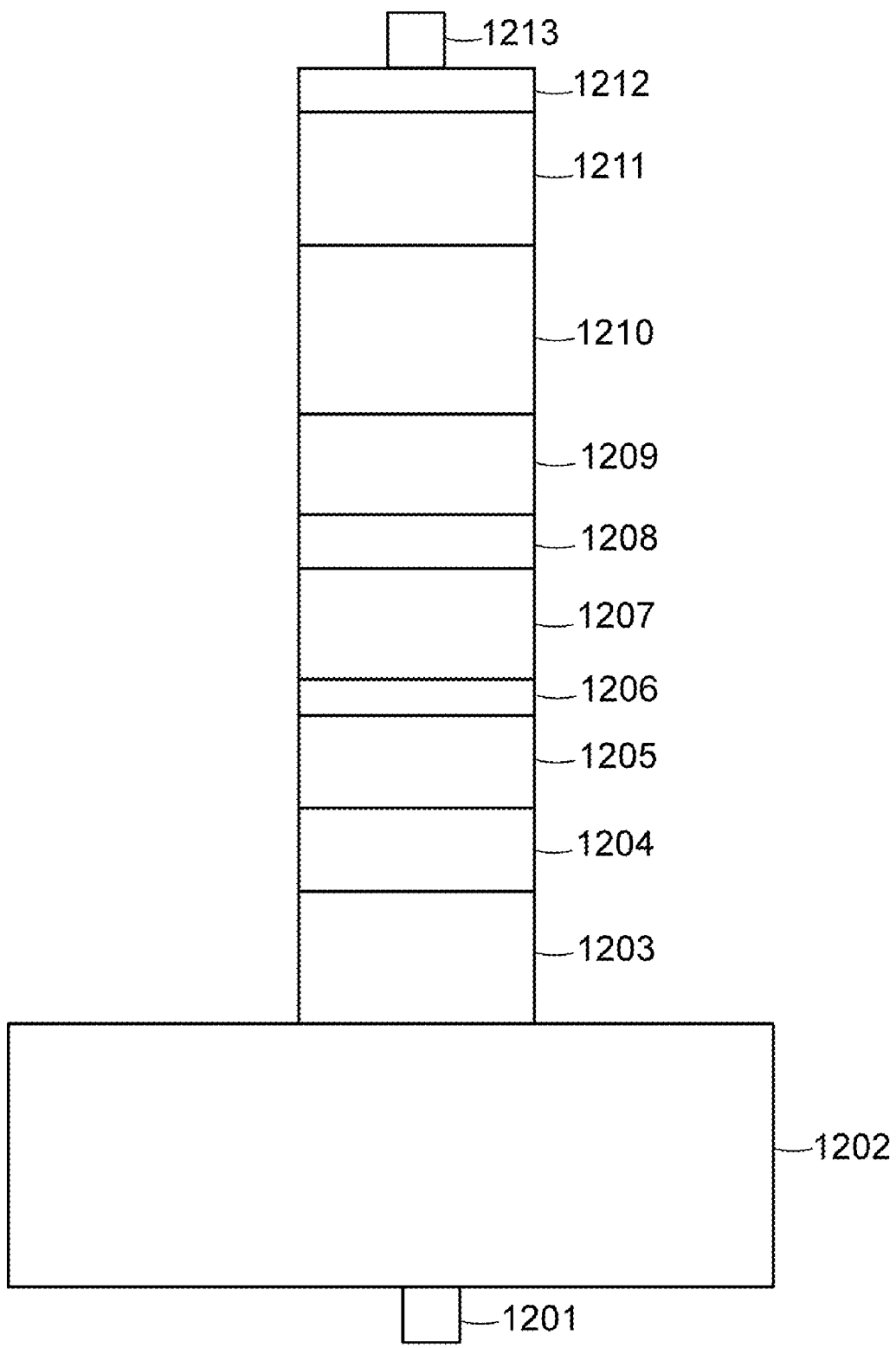
FIG. 12 illustrates a ZnO based edge emitting laser diode semiconductor device with slab geometry in accordance with the invention.

FIG. 12 illustrates a ZnO based edge emitting laser diode semiconductor device with slab geometry whereby the barrier and cladding layers serve as waveguides. Shaping the device into a slab geometry and formation of end mirrors preformed after removal of the wafer from the HBD system. The device of FIG. 12 is formed with semiconductor layers, electrical contacts, and a mirror on each end of the laser cavity, as shown. The components of the device of FIG. 12 (which is of course just one example of such a device in accordance with the invention—many variations are possible and within the spirit and scope of the invention) are as follows:

1201 Electrode
1202 n-type ZnO substrate
1203 50 nm ZnO buffer layer
1204 30 nm n-type ZnO:Ga
1205 30 nm n-type BeZnO:Ga
1206 10 nm n-type BeZnO:Ga
1207 30 nm undoped ZnO active layer
1208 10 nm p-type BeZnO:As
1209 30 nm p-type BeZnO:As
1210 70 nm p-type BeZnO:As
1211 50 nm p-type BeZnO:As
1212 Electrical contact layer
1213 Electrode Stimulated emission is from the active layer region located at one of the mirror faces. The semiconductor layers in an edge emitting laser diode device can be grown using the HBD method for film growth. Shaping the device and formation of two mirrored surfaces and two electrical contacts occur after removal of the wafer from the HBD system.

Examples of Other Embodiments of the Present Invention

An example of an embodiment of the present invention comprises a ZnO and BeZnO alloy based semiconductor device grown on an n-type ZnO single crystal substrate using the HBD method for film growth. The buffer layer may be ZnO or n-type doped ZnO, and the active layer may be undoped, n-type doped, or p-type doped. More than one active layer may be used, and the composition of material in each of those active layers may be the same, or may be different.

An example of an embodiment of the present invention comprises a ZnO and BeZnO alloy based semiconductor device grown on an n-type ZnO single crystal substrate using the HBD method for film growth. The active layer may be undoped, n-type doped, or p-type doped. The active layer may comprise a region with more than one active layer, and furthermore, each layer may be comprised of different semiconductor material. Examples of such materials include, but are not limited to ZnO and ZnO based alloys.

Another example of an embodiment of the present invention comprises a ZnO and BeZnO alloy based semiconductor device grown on a p-type ZnO single crystal substrate using the HBD method for film growth. The buffer layer may be ZnO or p-type doped ZnO, and layers between the buffer layer and active layer region are p-type, and those after deposition of the active layer are n-type. The active layer may be undoped, n-type doped, or p-type doped. The active layer may comprise a region with more than one active layer, and furthermore, each layer may be comprised of different semiconductor material. Examples of such materials include, but are not limited to ZnO and ZnO based alloys.

Further Examples of Alternate Embodiments of the Present Invention

A ZnO based LED device of the general type shown in FIG. 1 can be fabricated but with a metallic reflector-electrical contact layer as the topmost layer. As an example, a ZnO based light emitting diode semiconductor device can be comprised of an n-type substrate, a ZnO buffer layer, an n-type ZnO based cladding layer, an n-type ZnO based barrier layer, an active layer, a p-type ZnO based barrier layer, a p-type ZnO based cladding layer, and a metallic reflector-electrical contact layer. Semiconductor layer thicknesses can be the same as those for the device shown in FIG. 1, with each of the ZnO and BeZnO alloy layers deposited using, by way of example, the HBD process for film growth. The metallic reflector-electrical contact layer is grown after removal of the wafer from the HBD system.

A ZnO based LED device of the general type shown in FIG. 1 can be fabricated; however, with an added metallic reflector-electrical contact layer formed on the exposed face of the substrate, i.e., the face opposite to that on which the buffer layer is grown. A ZnO based light emitting diode semiconductor device is comprised of n-type ZnO based layers on the buffer layer, followed by an active layer region, and then followed by growth of p-type ZnO based layers. Each of the ZnO and BeZnO alloy layers can be deposited using, by way of example, the HBD process for film growth. The metallic reflector-electrical contact layer is grown on the substrate after removal of the wafer from the HBD system.

In various practices or embodiments of the invention, the substrate can be a single crystal substrate. In other embodiments, the substrate will not be a single crystal substrate.

The ZnO based layer region can in some embodiments be doped, and in other embodiments undoped.

The devices described herein can also be constructed without a ZnO based buffer layer region formed on the substrate, in which case one or more of the other layers described herein can be formed on the substrate without the ZnO based buffer layer region therebetween, e.g., a ZnO based layer region formed on the substrate (and then other layers formed on top of that layer), or a ZnO based first Bragg reflector layer region formed on the substrate (and then other layers formed on top of that layer).

Other materials can include one or more of ZnCdSeO, n-type ZnCdSeO, p-type ZnCdSeO, ZnCdSO, n-type ZnCdSO, p-type ZnCdSO, ZnSSeO, n-type ZnSSeO, p-type ZnSSeO, ZnSO, n-type ZnSO, and p-type ZnSeO alloy materials.

The substrate can also be selected to include one or more of the following, in addition to other materials noted elsewhere in this document: n-type GaAs, n-type ZnO, n-type GaN, glasses, plastics and polymers.

Other embodiments or examples of the invention can relate to such devices with one or more of the following characteristics:

1) at least one semiconductor oxide layer comprises Be with one or more of the alloys ZnCdOSSe, ZnCdSeO, ZnCdSO, ZnSSeO, and ZnSO for improvement of lattice matching between layers;

2) at least one semiconductor oxide layer comprises Be with one or more of the alloys ZnCdOSSe, ZnCdSeO, ZnCdSO, ZnSSeO, and ZnSO for improvement of lattice matching between a layer and the substrate;

3) at least one semiconductor oxide layer comprises Mg with the alloy BeZnO for improvement of lattice matching between layers; and 4) at least one semiconductor oxide layer comprises Mg with the alloy BeZnO for improvement of lattice matching between a layer and the substrate.

Still other embodiments and examples of devices like those discussed above and shown for example in FIG. 1 could comprise one or more of the following:

1) A p-n junction based semiconductor light emitting device comprising a ZnO based active layer region, a p-type layer region, and an n-type layer region;

2) A p-n junction based semiconductor light emitting device comprising a ZnO based active layer region, a p-type layer region, and an n-type layer region, wherein the active layer region is located between a p-type region and an n-type region;

3) A p-n junction based semiconductor light emitting device comprising a ZnO based active layer region, a p-type layer region, and an n-type layer region, wherein the active layer region is located between a p-type region and an n-type region, and wherein the energy band gap of the active layer region is smaller than that of the n-type region and is smaller than that of the p-type region Use of Phosphor Coatings A phosphor suitable for converting light from one or more shorter wavelengths can be used to produce light of longer wavelengths. This conversion process is used to generate photons of light with lower energy from photons with higher energy, and the process is sometimes called down-conversion. Semiconductor devices can be coated with one or more phosphors with selected colors to obtain a more desired spectral output from a light emitting semiconductor device by use of the down-conversion process.

Use of Roughened Surface and Damaged Material Regions

A roughened surface or damage to a bulk layer in a light emitting semiconductor device through which region light is emitted can be used to convert light from one or more shorter wavelengths to light of longer wavelengths, e.g., from green to red. This conversion process is due to scattering, and is used to generate photons of light with lower energy from those with higher energy, and can also be called down-conversion. Semiconductor layer surfaces and bulk regions can be roughened, for example, by use of mechanical damage, ion implantation, chemical etching, and by other means.

Further Examples and Variations of the Invention

In accordance with the invention, the following are among a range of further examples and variations that are possible and within the spirit and scope of the invention:

1) A ZnO based semiconductor LED can be grown with the active layer comprised of DH, QW, or MQW structures using doped and undoped ZnO and BeZnO semiconductor materials.

2) A ZnO based semiconductor LED can be grown with the active layer to comprised of doped or undoped ZnCdOSSe alloy semiconductor material.

3) A ZnO based semiconductor LED can be grown with the active layer selected from the list, but not limited to, consisting a DH, QW, or MQW with semiconductor material selected from the list, but not limited to, consisting of doped and undoped ZnO, doped and undoped BeZnO alloys, and doped or doped ZnCdOSSe alloys.

4) A ZnO based semiconductor LED can be grown with barrier and cladding layer semiconductor material selected from the list, but not limited to, consisting of doped and undoped ZnO, doped and undoped BeZnO alloys, and doped or doped ZnCdOSSe alloys.

5) A ZnO based semiconductor VCSEL can be grown with barrier and cladding layer semiconductor material selected from the list, but not limited to, consisting of doped and undoped ZnO, doped and undoped BeZnO alloys, and doped or doped ZnCdOSSe alloys.

6) A ZnO based semiconductor VCSEL can be grown with DBR semiconductor material selected from the list, but not limited to, consisting of doped and undoped ZnO, doped and undoped BeZnO alloys, and doped or doped ZnCdOSSe alloys.

7) A ZnO based semiconductor LD can be grown with the active layer comprised of doped or undoped ZnCdOSSe alloy semiconductor material.

8) A ZnO based semiconductor LD can be grown with the active layer selected from the list, but not limited to, consisting a DH, QW, or MQW with semiconductor material selected from the list, but not limited to, consisting of doped and undoped ZnO, doped and undoped BeZnO alloys, and doped or doped ZnCdOSSe alloys.

9) A ZnO based semiconductor LD can be grown with barrier and cladding layer semiconductor material selected from the list, but not limited to, consisting of doped and undoped ZnO, doped and undoped BeZnO alloys, and doped or doped ZnCdOSSe alloys.

10) The layers and structures that can be formed with ZnO, BeZnO semiconductor alloys, and/or ZnCdOSSe semiconductor alloys semiconductor material, including undoped, p-type doped, and n-type doped semiconductor material, can be used for fabricating photonic and electronic semiconductor devices for use in photonic and electronic applications.

11) A semiconductor device can be fabricated wherein the active layer region contains one, or more than one, active layer.

12) A semiconductor device can be fabricated wherein the active layer region contains one, or more than one, active layer material.

13) A semiconductor device can be fabricated wherein the active layer region contains active layers having different semiconductor materials that are selected from the list consisting of, but not limited to, ZnO, BeZnO alloys, and ZnCdOSSe alloys.

Uses for such devices include, but are not limited to, those in the list consisting of, but not limited to, LDs, VCSELS, LEDs, LEDs with phosphors added to obtain desired spectral emission, including, but not limited to, red, green, blue and white light sources.

Also in accordance with the invention, doped and undoped ZnCdOSSe semiconductor materials can be employed to fabricate LEDs that have one or a multiplicity of emission wavelengths in the spectral range from approximately 375 nm to approximately 710 nm.

Further in accordance with the invention, a BeZnO semiconductor material can be grown with an atomic fraction of Mg incorporated therein during growth, for use in applications to form lattice matched layers, wherein the ZnBeO material containing Mg may be undoped, p-type or n-type doped semiconductor material.

A device in accordance with the invention may be mounted in a flip-chip arrangement whereby an electrical connection is made to the substrate using an electrode of the design, for example the hatched area as shown in FIG. 5, and an electrical connection is made to the topmost deposited layer by pressing an electrode formed on layer with a design, for example the hatched area as shown in FIG. 6, against an In bump, for example, as shown in FIG. 7.

In accordance with the invention, the light emitting semiconductor device may be grown on a p-type ZnO single crystal substrate with either ZnO or p-type doped ZnO as the buffer layer, p-type deposited cladding and barrier layers between the buffer layer and active layer, an active layer, followed by growth of n-type barrier and cladding layers between the active layer and the topmost layer. The relative energy band gap values for this device should have features that are the same as those illustrated in FIG. 1. This device also may be mounted in a flip-chip arrangement whereby an electrical connection is made to the substrate using an electrode design, for example the hatched area as shown in FIG. 5, and an electrical connection is made to the topmost deposited layer by pressing an electrode formed on the topmost layer with a design, for example the hatched area as shown in FIG. 6, against an In bump.

Still further in accordance with the invention:

1) A metallic reflector-electrical contact layer can be formed on the second cladding layer region for a semiconductor device as illustrated in FIG. 1 to promote light extraction through the substrate.

2) A metallic reflector-electrical contact layer can be formed on the exposed face of the substrate for a semiconductor device as illustrated in FIG. 1 to promote light extraction through the topmost layer.

3) A semiconductor device like that illustrated in FIG. 1 can be coated entirely or in part with one or more phosphors with colors in the list consisting of, but not limited to, red, green, blue and white to obtain a more desired spectral intensity of the light emitted by the device.

4) The substrate of a semiconductor device as illustrated in FIG. 1 can be selectively damaged, the bulk and/or surface, by a process, or more than one process, selected from the list consisting of, but not limited to, chemical, mechanical and ion implantation, to obtain a more desired spectral intensity of the light emitted by the device.

5) The spectral intensity from a semiconductor device as illustrated in FIG. 1 can be changed by combination of damage to the substrate and use of one or more phosphor colors as coatings.

6) As illustrated in FIG. 12 a portion of semiconductor layers formed on a substrate can be selectively removed for purposes of reducing the width of the active layer region for fabrication of an edge emitting laser diode.

7) Other designs may be employed for the design of a VCSEL.

8) A number of VCSELs may be fabricated on one or more wafers to form an imaging system, and individual or groups of VCSELs can be assembled to form an imaging system.

9) Other designs may be employed for the design of an edge emitting laser diode.

Those skilled in the art will appreciate that various modifications, additions and other changes can be made in the materials, layers, structures and implementations described herein, and that various modifications are possible within the spirit and scope of the invention as claimed. The terms and expressions used herein are terms of description and not of limitation, and there is no intention in the use of such terms and expressions to exclude equivalents of the features shown and described, or portions thereof. In addition, any one or more features and aspects of the invention can be combined with one or more other features of the invention, without departing from the spirit and scope of the invention, which is limited solely by the appended claims.

We claim:

1. A p-n junction based semiconductor light emitting device, comprising:
    a substrate,
    a ZnO based buffer layer formed on said substrate,
    a ZnO based first cladding layer formed on said ZnO based layer,
    a ZnO based layer formed between said buffer layer and said first cladding layer,
    a ZnO based first barrier layer formed on said first cladding layer,
    a ZnO based active layer formed on said first barrier layer,
    a ZnO based second barrier layer formed on said active layer,
    a ZnO based second cladding layer formed on said second barrier layer, and
    a ZnO based topmost electrical contact layer formed on said second cladding layer,
    wherein at least one layer, selected from the group of layers consisting of the buffer layer, the layer formed between the buffer layer and the first cladding layer, the first cladding layer, the first barrier layer, the active layer, the second barrier layer, the second cladding layer, and the topmost electrical contact layer, comprises Be with one or more of the alloys ZnCdOSSe, ZnCdSeO, ZnCdSO, ZnSSeO and ZnSO, the atomic fraction of Be and the one or more alloys being selected such that a lattice structure of the at least one layer matches a lattice structure of an adjacent one of said group of layers.

2. The semiconductor device of claim 1, wherein any of the buffer layer, first cladding layer, first barrier layer, active layer, second barrier layer, and second cladding layer comprise at least one semiconductor material selected from the group consisting of ZnO, n-type ZnO, and p-type ZnO materials, and BeZnO, n-type BeZnO, p-type BeZnO, ZnCdOSSe, n-type ZnCdOSSe, p-type ZnCdOSSe, ZnCdSeO, n-type ZnCdSeO, p-type ZnCdSeO, ZnCdSO, n-type ZnCdSO, p-type ZnCdSO, ZnSSeO, n-type ZnSSeO, p-type ZnSSeO, ZnSO, n-type ZnSO, p-type ZnSO, ZnSeO, n-type ZnSeO, and p-type ZnSeO alloy materials.

3. The semiconductor device of claim 1 wherein a first electrode is formed for electrical connection to the substrate.

4. The semiconductor device of claim 3 wherein a second electrode is formed for electrical connection to the topmost electrical contact layer.

5. The semiconductor device of claim 1 wherein the structure of the active layer is selected from the group consisting of double heterostructure, single quantum well, and multiple quantum well.

6. The semiconductor device of claim 1 wherein the energy band gap of the first cladding layer is higher than that of the first barrier layer.

7. The semiconductor device of claim 1 wherein the energy band gap of the second cladding layer is higher than that of the second barrier layer.

8. The semiconductor device of claim 1 wherein the energy band gap of the first cladding layer, second cladding layer, first barrier layer, and second barrier layer are each higher than the energy band gap of the active layer.

9. The semiconductor device of claim 1, wherein the substrate is selected from the group consisting of n-type ZnO, n-type GaN, n-type GaAs, n-type SiC, and n-type silicon.

10. The semiconductor device of claim 1 wherein the substrate, the ZnO based buffer layer, the ZnO based layer formed on the buffer layer, the first cladding layer, and the first barrier layer are each n-type semiconductor material, and the second cladding layer and the second barrier layer are each p-type semiconductor material.

11. The semiconductor device of claim 1, wherein the ZnO based buffer layer is n-type doped ZnO based semiconductor material.

12. The semiconductor device of claim 1 wherein at least one of the group consisting of the substrate, the buffer layer, the layer formed between the buffer layer and the first cladding layer, the first cladding layer, the first barrier layer, the active layer, the second barrier layer, the second cladding layer, and the topmost electrical contact layer is doped with at least one element selected from the group consisting of boron, aluminum, gallium, indium, thallium, fluorine, chlorine, bromine, and iodine.

13. The semiconductor device of claim 1 wherein at least one of the group consisting of the substrate, the buffer layer, the layer formed between the buffer layer and the first cladding layer, the first cladding layer, the first barrier layer, the active layer, the second barrier layer, the second cladding layer, and the topmost electrical contact layer is doped with gallium.

14. The semiconductor device of claim 1 further comprising an electrode electrically coupled to the topmost electrical contact layer or to the substrate, the electrode formed of a material comprising Ni—Au.

15. The semiconductor device of claim 1 wherein the semiconductor material type in the ZnO based active layer is selected from the list consisting of undoped, n-type doped and p-type doped.

16. the semiconductor device of claim 1 wherein the material in the ZnO based active layer comprises a BeZnO based alloy.

17. The semiconductor device of claim 1 wherein at least a portion of the substrate has been subjected to at least one process comprising any of chemical etching, ion implantation, and mechanical roughening.

18. The semiconductor device of claim 1 wherein the device emits at least one wavelength between 117 nm and 710 nm.

19. The semiconductor device of claim 1 wherein the color of light emitted by the device comprises at least one color, the at least one color selected from the list comprising red, green, blue, white, and ultraviolet.

20. The semiconductor device of claim 1 wherein the color of light emitted by the device is white.

21. The semiconductor device of claim 1 wherein the substrate is selected from the group consisting of n-type ZnO, n-type GaN, glasses, plastics and polymers.

22. A p-n junction based semiconductor light emitting device, comprising:
   a substrate,
   a ZnO based first cladding layer formed on the ZnO based layer,
   a ZnO based layer formed between the substrate and the first cladding layer,
   a ZnO based first barrier layer formed on the first cladding layer,
   a ZnO based active layer formed on the first barrier layer,
   a ZnO based second barrier layer formed on the active layer,
   a ZnO based second cladding layer formed on the second barrier layer, and at least one contact layer selected from the group consisting of:
   (1) a ZnO based topmost electrical contact layer formed on the second cladding layer, and (2) a metallic reflector/electrical contact layer formed on any of said second cladding layer or an exposed face of the substrate,
   wherein at least one layer selected from the group of layers consisting of the layer formed between the substrate and the first cladding layer, the first cladding layer, the first barrier layer, the active layer, the second barrier layer, the second cladding layer, and the at least one contact layer comprises Be with one or more of the alloys ZnCdOSSe, ZnCdSeO, ZnCdSO, ZnSSeO and ZnSO, the atomic fraction of Be and the one or more alloys being selected such that a lattice structure of the at least one layer matches a lattice structure of an adjacent one of said group of layers.

23. A p-n junction based semiconductor light emitting device comprising a ZnO based active layer, a p-type layer, an n-type layer, and an oxide layer comprising Be with one or more of the alloys ZnCdOSSe, ZnCdSeO, ZnCdSO, ZnSSeO and ZnSO, the atomic fraction of Be and the one or more alloys being selected such that a lattice structure of the oxide layer matches a lattice structure of an adjacent one of the active layer, p-type layer, and n-type layer.

24. The device of claim 23 wherein the active layer is located between the p-type layer and the n-type layer.

* * * * *